US012659615B2

(12) United States Patent
Morishita

(10) Patent No.: US 12,659,615 B2
(45) Date of Patent: Jun. 16, 2026

(54) SEMICONDUCTOR DEVICE, METHOD FOR CONTROLLING THE SEMICONDUCTOR DEVICE, AND CONTROL PROGRAM

(71) Applicant: Renesas Electronics Corporation, Tokyo (JP)

(72) Inventor: Fukashi Morishita, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 56 days.

(21) Appl. No.: 18/915,626

(22) Filed: Oct. 15, 2024

(65) Prior Publication Data

US 2025/0142228 A1 May 1, 2025

(30) Foreign Application Priority Data

Oct. 26, 2023 (JP) ................................ 2023-183664

(51) Int. Cl.

| | |
|---|---|
| ***H04N 25/633*** | (2023.01) |
| ***H03K 5/24*** | (2006.01) |
| ***H03K 23/00*** | (2006.01) |
| ***H03L 7/081*** | (2006.01) |
| ***H03L 7/089*** | (2006.01) |
| ***H04N 25/40*** | (2023.01) |

(52) U.S. Cl.

CPC ......... *H04N 25/633* (2023.01); *H03K 23/005* (2013.01); *H03L 7/0816* (2013.01); *H03L 7/0891* (2013.01); *H04N 25/40* (2023.01); *H03K 5/24* (2013.01)

(58) Field of Classification Search

CPC ...... H04N 25/78; H04N 25/40; H04N 25/633; H03L 7/0891; H03L 7/0816; H03K 23/005; H03K 5/24

USPC ........................................................ 348/245

See application file for complete search history.

(56) References Cited

U.S. PATENT DOCUMENTS

| | | | | |
|---|---|---|---|---|
| 9,143,152 | B2 * | 9/2015 | Yamazaki | H03M 1/34 |
| 9,467,636 | B2 * | 10/2016 | Nakamura | H04N 25/771 |
| 10,659,055 | B1 * | 5/2020 | Sakurai | H04N 25/61 |
| 11,133,822 | B2 * | 9/2021 | Nakano | H04N 25/616 |
| 11,317,047 | B2 * | 4/2022 | Han | H04N 25/78 |

(Continued)

OTHER PUBLICATIONS

Morishita, F. et al., "A 30.2-μVrms Horizontal Streak Noise 8.3-Mpixel 60-Frames/s CMOS Image Sensor With Skew-Relaxation ADC and On-Chip Testable Ramp Generator for Surveillance Camera", IEEE Journal of Solid-State Circuits, vol. 57, No. 10, Oct. 2022.

*Primary Examiner* — Pritham D Prabhakher

(74) *Attorney, Agent, or Firm* — Rimon P.C.

(57) ABSTRACT

A semiconductor device according to this disclosure includes: a comparator circuit; a counter circuit; and a latch circuit that stores a count value of the counter circuit at a timing when an output signal of the comparator circuit changes, the counter circuit includes: a multiphase signal generator; and a plurality of flip-flop circuits including a first-stage flip-flop and second-stage and subsequent flip-flops, the first-stage flip-flop takes in an inverted signal of an output signal of a flip-flop in a final stage and each of the second-stage and subsequent flip-flops takes in an output signal of a flip-flop in a preceding stage in synchronization with each of the plurality of clock signals, and an output signal of each of the plurality of flip-flop circuits is output as a count signal of the count value.

19 Claims, 22 Drawing Sheets

(56) References Cited

U.S. PATENT DOCUMENTS

| | | | | |
|---|---|---|---|---|
| 11,641,534 | B2 * | 5/2023 | Han | H03K 23/005 348/222.1 |
| 11,743,449 | B2 * | 8/2023 | Suto | H04N 17/002 348/175 |
| 12,040,813 | B2 * | 7/2024 | Lizuka | H03K 23/542 |
| 12,088,948 | B2 * | 9/2024 | Lee | H04N 25/616 |
| 2009/0026352 | A1 * | 1/2009 | Shimomura | H04N 25/779 250/214 R |
| 2011/0074994 | A1 * | 3/2011 | Wakabayashi | H03M 1/08 348/E5.091 |
| 2011/0205100 | A1 * | 8/2011 | Bogaerts | H04N 25/767 341/169 |
| 2014/0028776 | A1 * | 1/2014 | Kawamura | G03G 15/043 347/249 |
| 2014/0061437 | A1 * | 3/2014 | Yamazaki | H03M 1/14 341/155 |
| 2014/0098272 | A1 * | 4/2014 | Nakamura | H04N 25/78 348/308 |
| 2019/0109599 | A1 * | 4/2019 | Matsuzawa | H03M 1/1295 |
| 2020/0053310 | A1 * | 2/2020 | Ushinaga | H03M 1/56 |
| 2020/0120302 | A1 * | 4/2020 | Korthout | H04N 25/617 |
| 2020/0153440 | A1 * | 5/2020 | Sakurai | H04N 25/61 |
| 2021/0135682 | A1 * | 5/2021 | Nakano | H04N 25/616 |
| 2021/0160450 | A1 * | 5/2021 | Han | H03K 23/542 |
| 2022/0094907 | A1 * | 3/2022 | Suto | H04N 25/79 |
| 2022/0217296 | A1 * | 7/2022 | Han | H03K 23/542 |

* cited by examiner

SEMICONDUCTOR DEVICE, METHOD FOR CONTROLLING THE SEMICONDUCTOR DEVICE, AND CONTROL PROGRAM

CROSS-REFERENCE TO RELATED APPLICATIONS

The disclosure of Japanese Patent Application No. 2023-183664 filed on Oct. 26, 2023 including the specification, drawings and abstract is incorporated herein by reference in its entirety.

BACKGROUND

This disclosure relates to a semiconductor device, a method for controlling the semiconductor device, and a control program, and relates to, for example, a semiconductor device suitable for realizing high-quality operation, a method for controlling the semiconductor device, and a control program.

In general, an image sensor includes at least a plurality of pixels, a comparison circuit that compares a pixel signal (measured signal) indicating a potential corresponding to the amount of light received by the pixel with a ramp signal, and a counter circuit that counts a period from the start of comparison between the pixel signal and the ramp signal by the comparison circuit to the matching between the pixel signal and the ramp signal. The count value of the counter circuit is used as a digital signal obtained through AD conversion of the pixel signal.

There are disclosed techniques listed below. [Non-Patent Document 1] F. Morishita, et el., "A 30.2-μVrms Horizontal Streak Noise 8.3-Mpixel 60-Frames/s CMOS Image Sensor With Skew-Relaxation ADC and On-Chip Testable Ramp Generator for Surveillance Camera", IEEE JOURNAL OF SOLID-STATE CIRCUITS, VOL. 57, NO. 10, October 2022

For example, Non-Patent Document 1 discloses a technique related to an image sensor.

SUMMARY

An image sensor is required to acquire a high-quality image by suppressing noise. Here, the noise is suppressed by repeating, a plurality of times at a high speed, a counting operation by a counter circuit of a period from the start of the comparison between a pixel signal and a ramp signal by a comparison circuit to the matching between the pixel signal and the ramp signal, and averaging the obtained count values.

However, when the counting operation by the counter circuit is sped up, the waveform of a plurality of bits representing the count values collapses, and thus there has been a problem of a degradation in the accuracy of the counting operation by the counter circuit. Other problems and novel features would become apparent from the description of the present specification and the accompanying drawings.

A semiconductor device according to this disclosure includes a semiconductor chip, wherein the semiconductor chip includes on a surface thereof: a comparator circuit having one terminal to which a measured signal is input and the other terminal to which a r reference voltage signal whose potential periodically linearly changes is input; a counter circuit whose count value changes in accordance with a time change of the reference voltage signal; and a latch circuit that is connected to the comparator circuit and stores the count value of the counter circuit at a timing when an output signal from the comparator circuit changes, wherein the counter circuit includes: a multiphase signal generator that shifts a phase of a reference clock signal and generates a plurality of clock signals having phases different from each other; and a plurality of flip-flop circuits that are connected to the multiphase signal generator and are continuously connected to each other, and wherein the plurality of flip-flop circuits include a first-stage flip-flop and second-stage and subsequent flip-flops, the first-stage flip-flop takes in an inverted signal of an output signal of a flip-flop in a final stage and each of the second-stage and subsequent flip-flops takes in an output signal of a flip-flop in a preceding stage in synchronization with each of the plurality of clock signals, and an output signal of each of the plurality of flip-flop circuits is output as a count signal of the count value.

A method for controlling a semiconductor device according to this disclosure is a method for controlling a semiconductor device including a semiconductor chip, wherein the semiconductor chip includes on a surface thereof: a comparator circuit having one terminal to which a measured signal is input and the other terminal to which a reference voltage signal whose potential periodically linearly changes is input; a counter circuit whose count value changes in accordance with a time change of the reference voltage signal; and a latch circuit that is connected to the comparator circuit and stores the count value of the counter circuit at a timing when an output signal from the comparator circuit changes, wherein the counter circuit includes: a multiphase signal generator that shifts a phase of a reference clock signal and generates a plurality of clock signals having phases different from each other; and a plurality of flip-flop circuits that are connected to the multiphase signal generator and are continuously connected to each other, and wherein the plurality of flip-flop circuits include a first-stage flip-flop and second-stage and subsequent flip-flops, the first-stage flip-flop takes in an inverted signal of an output signal of a flip-flop in a final stage and each of the second-stage and subsequent flip-flops takes in an output signal of a flip-flop in a preceding stage in synchronization with each of the plurality of clock signals, and an output signal of each of the plurality of flip-flop circuits is output as a count signal of the count value, the method comprising: causing the comparator circuit to compare a black color signal that is a black pixel signal with the reference voltage signal; causing the latch circuit to latch a first count value that is a count value of the counter circuit in a period from start of a comparison between the black color signal and the reference voltage signal at the comparator circuit to matching between the black color signal and the reference voltage signal; causing the comparator circuit to compare a pixel signal that is the measured signal with the reference voltage signal; causing the latch circuit to latch a second count value that is a count value of the counter circuit in a period from start of a comparison between the pixel signal and the reference voltage signal at the comparator circuit to matching between the pixel signal and the reference voltage signal; and handling a difference between the second count value and the first count value as a digital signal corresponding to the pixel signal.

A control program according to this disclosure is a control program causing a computer to execute control processing in a semiconductor device, the semiconductor device including a semiconductor chip, wherein the semiconductor chip includes on a surface thereof: a comparator circuit having one terminal to which a measured signal is input and the other terminal to which a reference voltage signal whose potential periodically linearly changes is input; a counter circuit whose count value changes in accordance with a time change of the reference voltage signal; and a latch circuit that is connected to the comparator circuit and stores the count value of the counter circuit at a timing when an output signal from the comparator circuit changes, wherein the counter circuit includes: a multiphase signal generator that shifts a phase of a reference clock signal and generates a plurality of clock signals having phases different from each other; and a plurality of flip-flop circuits that are connected to the multiphase signal generator and are continuously connected to each other, and wherein the plurality of flip-flop circuits include a first-stage flip-flop and second-stage and subsequent flip-flops, the first-stage flip-flop takes in an inverted signal of an output signal of a flip-flop in a final stage and each of the second-stage and subsequent flip-flops takes in an output signal of a flip-flop in a preceding stage in synchronization with each of the plurality of clock signals, and an output signal of each of the plurality of flip-flop circuits is output as a count signal of the count value, the control program causing the computer to execute the processing of: causing the comparator circuit to compare a black color signal that is a black pixel signal with the reference voltage signal; causing the latch circuit to latch a first count value that is a count value of the counter circuit in a period from start of a comparison between the black color signal and the reference voltage signal at the comparator circuit to matching between the black color signal and the reference voltage signal; causing the comparator circuit to compare a pixel signal that is the measured signal with the reference voltage signal; causing the latch circuit to latch a second count value that is a count value of the counter circuit in a period from start of a comparison between the pixel signal and the reference voltage signal at the comparator circuit to matching between the pixel signal and the reference voltage signal; and handling a difference between the second count value and the first count value as a digital signal corresponding to the pixel signal.

This disclosure can provide a semiconductor device capable of realizing high-quality operation, a method for controlling the semiconductor device, and a control program.

DETAILED DESCRIPTION

Figure 1:
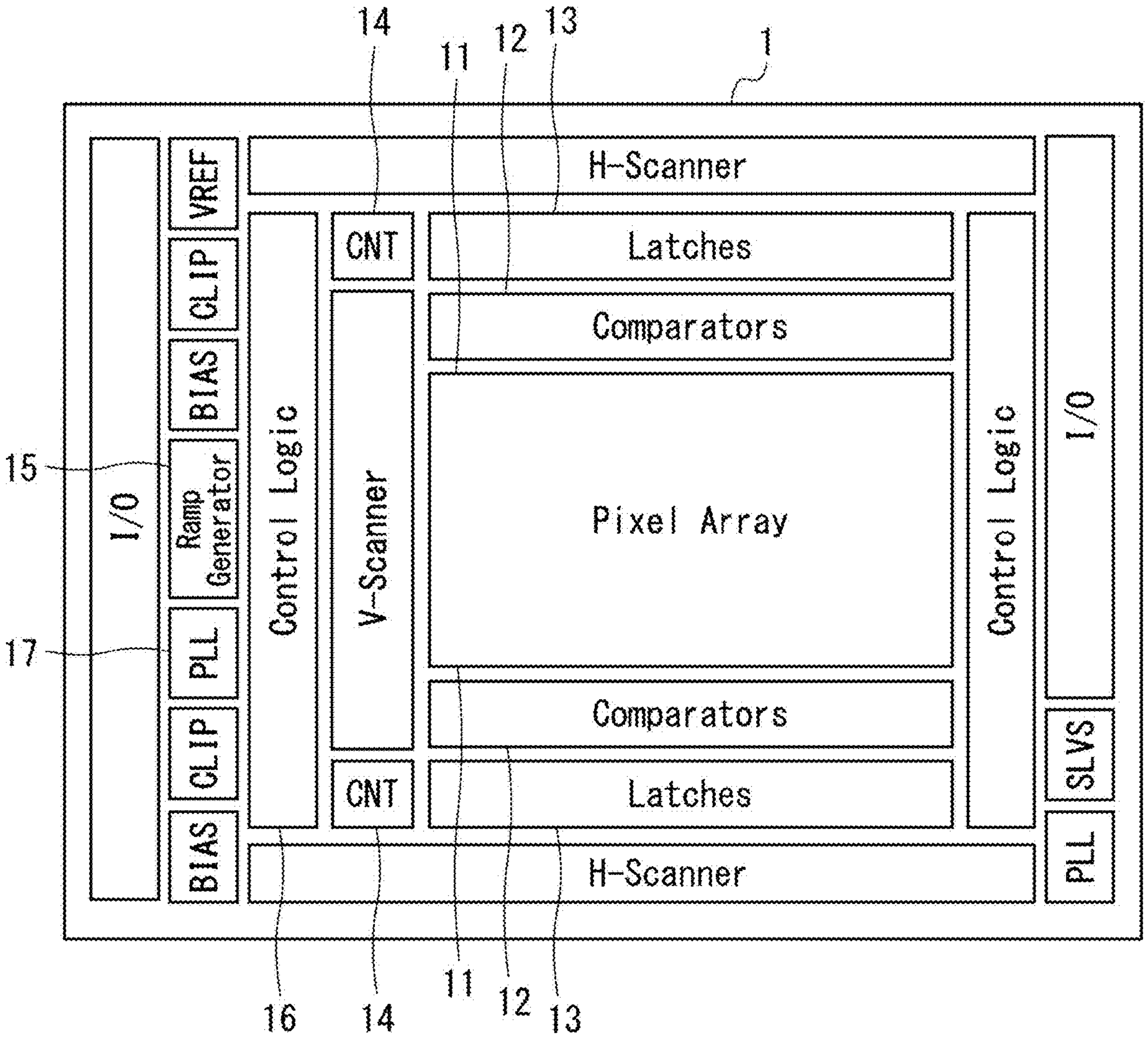
FIG. 1 is a block diagram illustrating a configuration example of an image sensor according to a first embodiment.

Hereinafter, embodiments will be described with reference to the drawings. Since the drawings are simplified, the technical scope of the embodiments should not be narrowly interpreted based on the description of the drawings. In addition, the same elements are denoted by the same reference numerals, and redundant description will be omitted.

In the following embodiments, the description will be divided into a plurality of sections or embodiments when necessary for convenience. However, unless otherwise specified, they are not unrelated to each other, and one is in a relationship of partial or entire modifications, application examples, detailed descriptions, supplementary descriptions, or the like of the other. In addition, in the following embodiments, when the number of elements or the like (including number of pieces, numerical value, amount, range, and the like) is mentioned, the number is not limited to a specific number unless otherwise specified or obviously limited to the specific number in principle, and the number may be equal to or more than the specific number or may be equal to or less than the specific number.

Furthermore, in the following embodiments, the components (including operation steps or the like) are not necessarily essential unless otherwise specified or considered to be obviously essential in principle. Similarly, in the following embodiments, when the shape, positional relationship, or the like of the components or the like are mentioned, those substantially approximate or similar to the shape or the like is included unless otherwise specified or considered obviously otherwise in principle. The same applies to the above-described number or the like (including number of pieces, numerical value, amount, range, and the like).

Preliminary Study by Inventors

Figure 13:
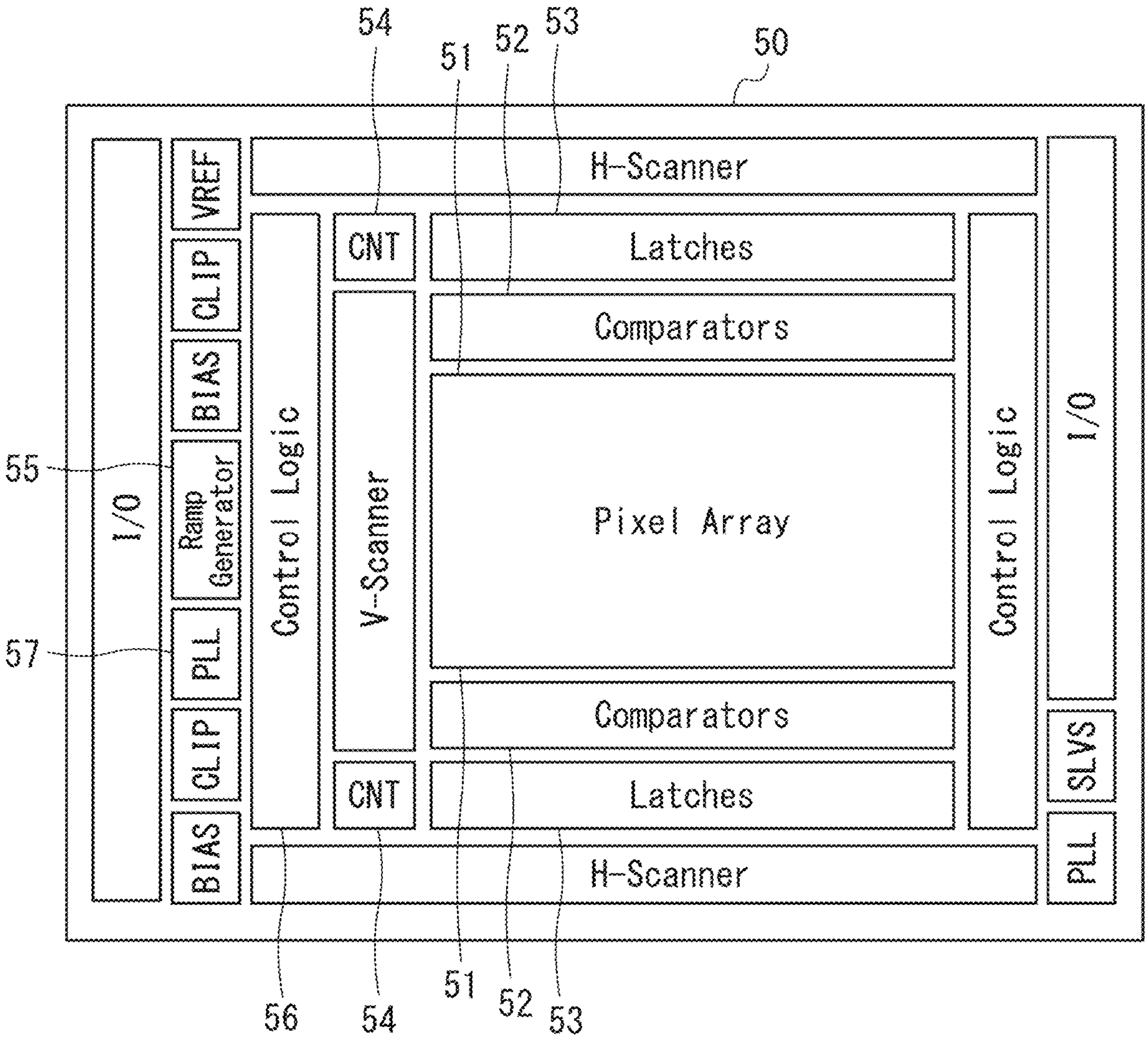
FIG. 13 is a block diagram illustrating a configuration example of a preliminarily studied image sensor.
Figure 14:
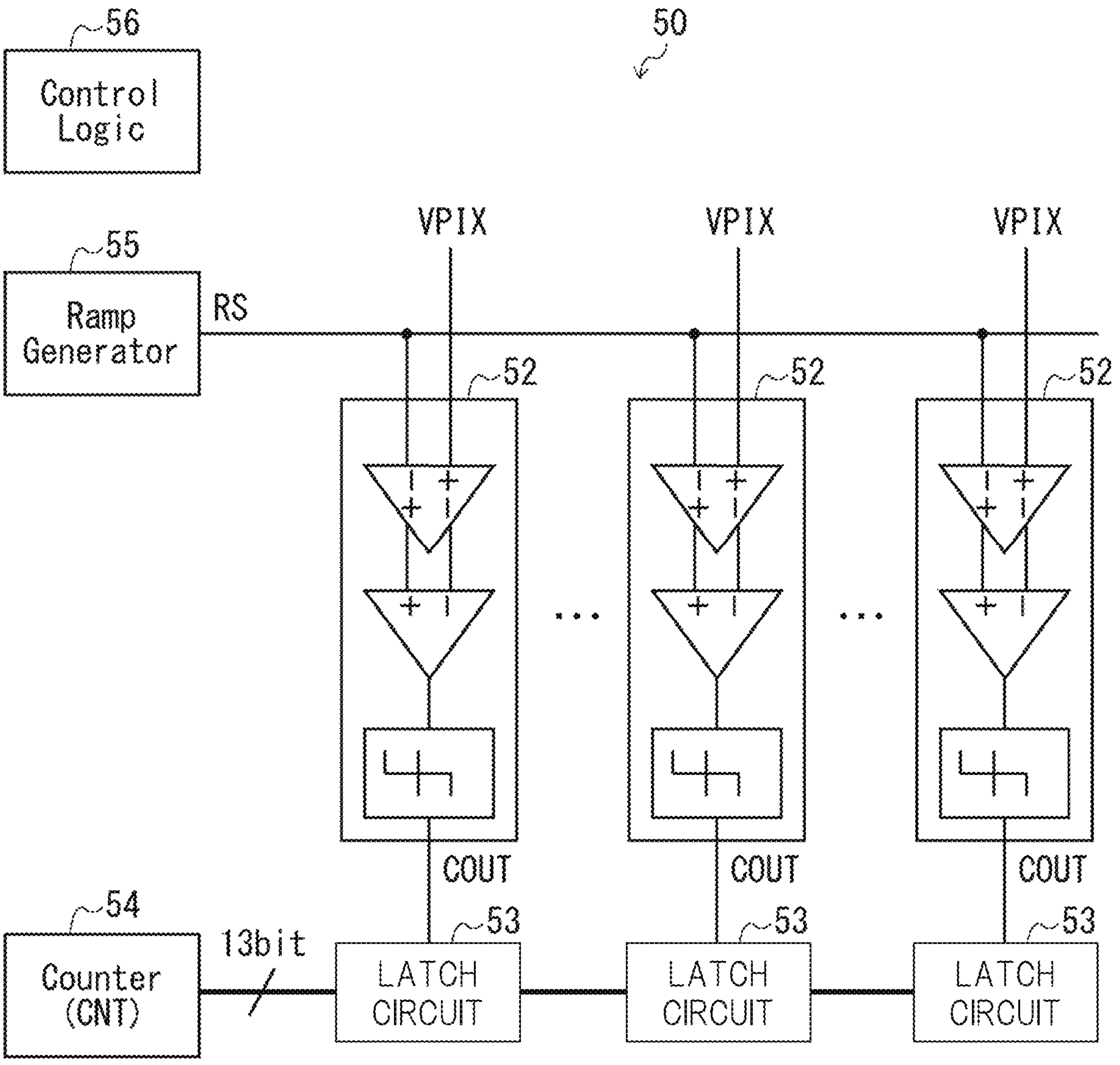
FIG. 14 is a block diagram more specifically illustrating a configuration of a part of the image sensor illustrated in FIG. 13.

First, an image sensor preliminarily studied by the present inventor will be described. FIG. 13 is a block diagram illustrating a configuration example of a preliminarily studied image sensor 50. FIG. 14 is a block diagram more specifically illustrating a configuration of a part of the image sensor 50.

As illustrated in FIGS. 13 and 14, the image sensor 50 includes at least a plurality of pixels 51 provided in a matrix, a plurality of comparison circuits 52 corresponding to the number of columns of the plurality of pixels 51, a plurality of latch circuits 53 corresponding to the number of columns of the plurality of pixels 51, a counter circuit 54, a ramp generation circuit 55, a control circuit 56, and a PLL circuit 57. These circuits are formed on a surface of a semiconductor chip. Note that, in the example of FIG. 13, a group of the plurality of comparison circuits 52, a group of the plurality of latch circuits 53, and the counter circuit 54 are arranged in respective regions on upper and lower sides of a region where the plurality of pixels 51 are formed on the surface of the semiconductor chip. A plurality of AD conversion circuits including the comparison circuits 52 and the latch circuits 53 are arranged along one side of the quadrangular semiconductor chip. Since the image sensor 50 is provided with several thousands of AD converters including the comparison circuits 52 and the latch circuits 53, each AD converter adopts a simple configuration of a single-slope integrated AD converter.

The ramp signal generation circuit 55 generates a ramp signal (reference voltage signal) RS whose potential linearly changes in a horizontal scanning period (access period to a plurality of pixels in each row). Here, a case where the ramp signal generation circuit 55 generates a ramp signal RS whose potential linearly decreases in the horizontal scanning period will be described as an example.

Figure 15:
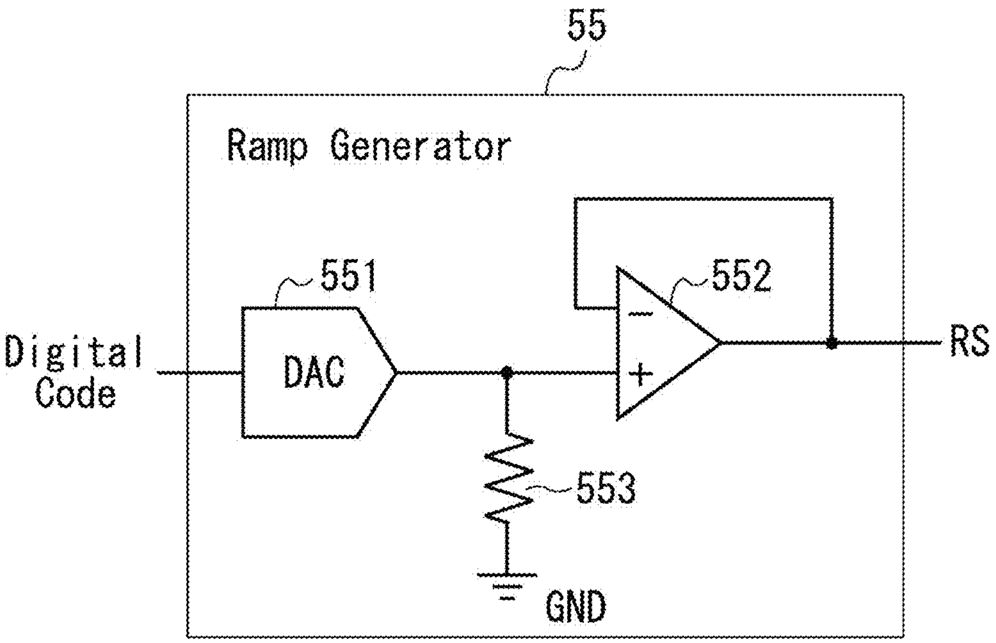
FIG. 15 is a diagram illustrating a configuration example of a ramp signal generation circuit provided in the image sensor illustrated in FIG. 13.

FIG. 15 is a diagram illustrating a configuration example of the ramp signal generation circuit 55. As illustrated in FIG. 15, the ramp signal generation circuit 55 includes a DA converter (DAC) 551, an operational amplifier 552, and a resistive element 553. The resistive element 553 is provided between a non-inverting input terminal of the operational amplifier 552 and a ground voltage terminal to which a ground voltage GND is supplied. The DA converter 551 converts a digital code input from the outside into an analog voltage. The output voltage of the DA converter 551 is supplied to the non-inverting input terminal of the operational amplifier 552. An output signal of the operational amplifier 552 is fed back to an inverting input terminal of the operational amplifier 552. The operational amplifier 552 amplifies and outputs a potential difference between the voltages supplied to each of the two input terminals. The output voltage of the operational amplifier 522 is used not only as the feedback signal to the inverting input terminal of the operational amplifier 552 but also as the ramp signal RS. Here, the ramp signal generation circuit 55 generates a ramp signal RS whose potential linearly changes with a slope (slew rate) corresponding to a digital code.

The PLL circuit 57 generates a reference clock signal CLK. Here, a case where the PLL circuit 57 generates a reference clock signal CLK having a frequency of 1.34 GHz will be described as an example.

Each comparison circuit 52 compares a pixel signal (measured signal) VPIX indicating a potential corresponding to the amount of light received by the pixel with the ramp signal RS whose potential linearly decreases in the horizontal scanning period, and outputs a comparison result COUT. For example, when the potential of the ramp signal RS changes from a potential equal to or higher than the potential of the pixel signal VPIX to a potential lower than the potential of the pixel signal VPIX, each comparison circuit 52 changes (rises) the comparison result COUT from an L level to an H level.

The counter circuit 54 performs a count-up operation in synchronization with the reference clock signal CLK.

Each latch circuit 53 latches a count value of the counter circuit 54 at the timing when the comparison result COUT of the corresponding comparison circuit 52 changes from the L level to the H level. That is, each latch circuit 53 latches the count value of the counter circuit 54 counted in the period from the start of the comparison between the pixel signal VPIX and the ramp signal RS by the corresponding comparison circuit 52 to the matching between the pixel signal VPIX and the ramp signal RS. The latched count value is input to a processing circuit (not illustrated) as a digital signal obtained through AD conversion of the pixel signal.

Figure 16:
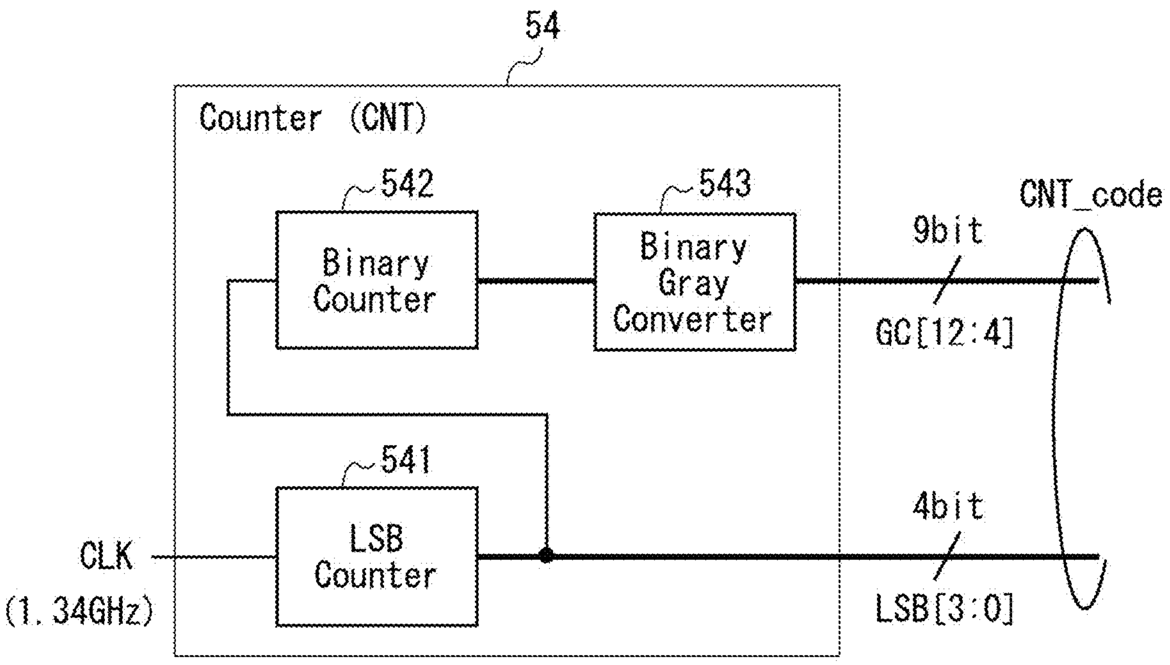
FIG. 16 is a block diagram illustrating a configuration example of a counter circuit provided in the image sensor illustrated in FIG. 13.

FIG. 16 is a block diagram illustrating a configuration example of the counter circuit 54. Here, a case where the counter circuit 54 outputs a count signal CNT code of a count value substantially corresponding to 12 binary digits represented by a 13-bit value will be described as an example.

As illustrated in FIG. 16, the counter circuit 54 includes an LSB counter 541, a binary counter 542, and a binary gray converter 543. The LSB counter 541 performs a count-up operation of a count value LSB [3:0] substantially corresponding to 3 binary digits represented by a value of the lower 4 bits of a count value represented by a 13-bit value. The binary counter 542 performs a count-up operation of a count value of a binary code represented by a value of the upper 9 bits of the count value represented by a 13-bit value. The binary gray converter 543 converts the count value of the binary code output from the binary counter 542 into a count value GC [12:4] of a gray code. As a result, the change in the value of the bit associated with the count-up operation is reduced, thus reducing erroneous operation.

Then, the counter circuit 54 outputs a count signal CNT code of a 13-bit count value including the count value GC [12:4] and the count value LSB [3:0].

The control circuit 56 performs general control of the image sensor 50. Furthermore, the control circuit 56 performs control for offset removal in AD conversion processing described later and control for noise suppression in AD conversion processing described later.

Figure 17:
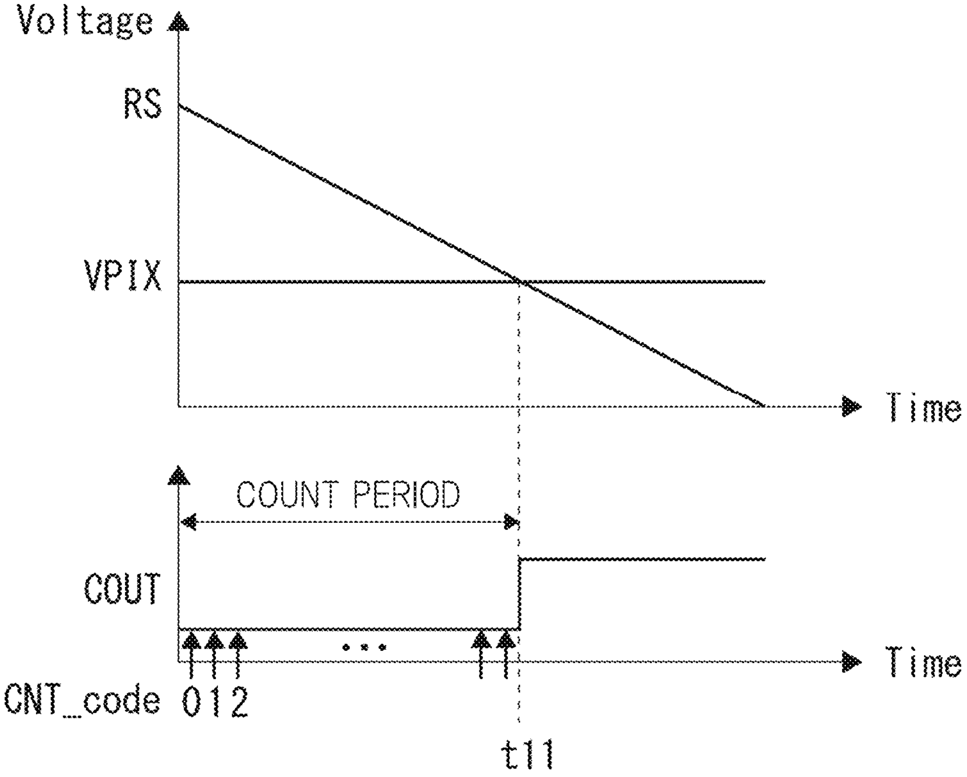
FIG. 17 is a timing chart illustrating a first example of AD conversion processing by the image sensor illustrated in FIG. 13.

FIG. 17 is a timing chart illustrating a first example of AD conversion processing by the image sensor 50. As illustrated in FIG. 17, in the image sensor 50, when the potential of the ramp signal RS changes from a potential equal to or higher than the potential of the pixel signal VPIX to a potential lower than the potential of the pixel signal VPIX, each comparison circuit 52 changes the comparison result COUT from the L level to the H level (time t11). Each latch circuit 53 latches a count value of the counter circuit 54 at the timing when the comparison result COUT of the corresponding comparison circuit 52 changes from the L level to the H level. The latched count value is input to a processing circuit (not illustrated) as a digital signal obtained through AD conversion of the pixel signal.

Figure 18:
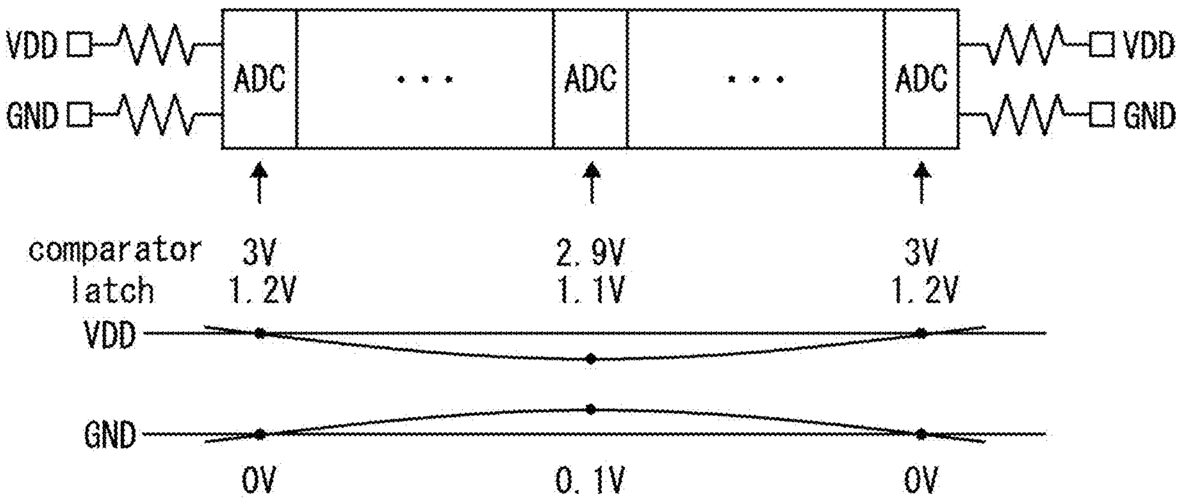
FIG. 18 is a diagram for describing a problem with the first example of AD conversion processing by the image sensor illustrated in FIG. 13.

FIG. 18 is a diagram for describing a problem with a first example of AD conversion processing by the image sensor 50. As illustrated in FIG. 18, in the image sensor 50, several thousands of AD converters including the comparison circuit 52 and the latch circuit 53 are arranged in columns. Here, in most cases, power supply to several thousands of AD converters arranged in columns is performed from both ends. For this reason, among several thousands of AD converters arranged in columns, a power supply voltage of the AD converter arranged at the center drops due to IR drop. For example, assuming that 4096 AD converters are arranged in columns, a power supply voltage VDD supplied to the comparison circuit 52 and the latch circuit 53 constituting the AD converter arranged at the end is 3.0 V and 1.2 V, respectively, and the current consumption per AD converter is about 10 uA, the power supply voltage VDD supplied to the comparison circuit 52 and the latch circuit 53 constituting the AD converter arranged at the center drops to about 2.9 V and 1.1 V, respectively. In addition, the ground voltage GND of the AD converter arranged at the center rises to about 0.1 V.

Figure 19:
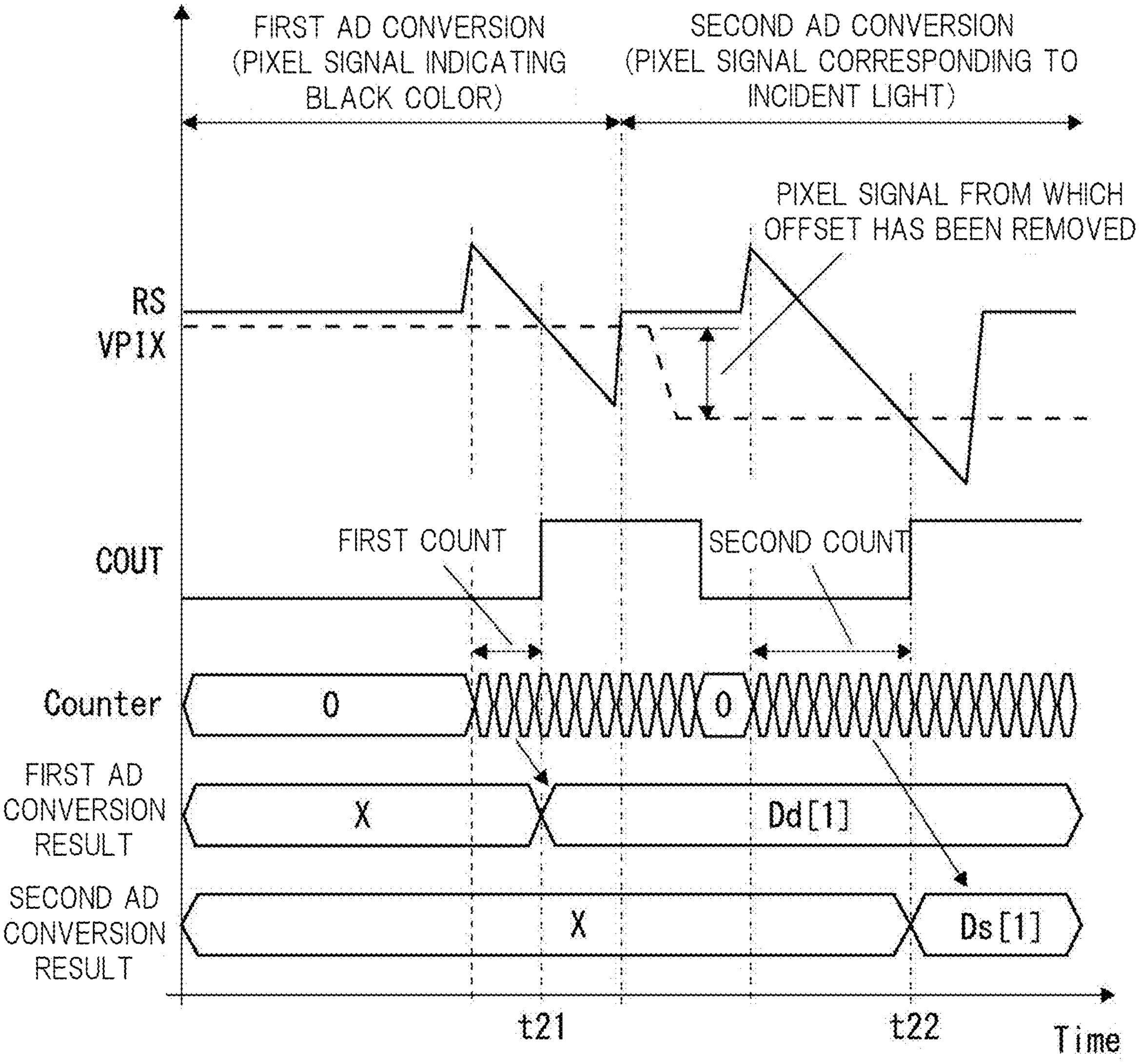
FIG. 19 is a timing chart illustrating a second example of AD conversion processing by the image sensor illustrated in FIG. 13.

Thus, the inventor studied AD conversion processing as illustrated in FIG. 19. FIG. 19 is a timing chart illustrating a second example of AD conversion processing by the image sensor 50. In the example of FIG. 19, an offset generated in each AD converter is removed by AD conversion processing by digital correlated double sampling (CDS).

First, the control circuit 56 causes each comparison circuit 52 and each latch circuit 53 to execute the following processing as first AD conversion processing. Specifically, each comparison circuit 52 compares a pixel signal VPIX indicating a potential of a black color in which light is not received by the pixel (hereinafter referred to as a black color signal VPIX) with the ramp signal RS, and outputs the comparison result COUT. For example, when the potential of the ramp signal RS changes from a potential equal to or higher than the potential of the black color signal VPIX to a potential lower than the potential of the black color signal VPIX, each comparison circuit 52 changes the comparison result COUT from the L level to the H level (time t21). Each latch circuit 53 latches a count value of the counter circuit 54 at the timing when the comparison result COUT of the corresponding comparison circuit 52 changes from the L level to the H level (time t21). The latched count value is used as a digital value obtained by AD-converting the black color signal VPIX. Note that the pixel signal indicating the potential of a black color in which light is not received by the pixel is a pixel signal in a state where no external light is incident with the shutter closed.

Then, the control circuit 56 causes each comparison circuit 52 and each latch circuit 53 to execute the following processing as second AD conversion processing. Specifically, each comparison circuit 52 compares a pixel signal VPIX indicating a potential corresponding to the amount of light received by the pixel with the ramp signal RS, and outputs the comparison result COUT. For example, when the potential of the ramp signal RS changes from a potential equal to or higher than the potential of the pixel signal VPIX to a potential lower than the potential of the pixel signal VPIX, each comparison circuit 52 changes the comparison result COUT from the L level to the H level (time t22). Each latch circuit 53 latches a count value of the counter circuit 54 at the timing when the comparison result COUT of the corresponding comparison circuit 52 changes from the L level to the H level (time t22). The latched count value is used as a digital value obtained by AD-converting the pixel signal VPIX.

Subsequently, the control circuit 56 can obtain a digital value of the pixel signal from which the offset has been removed by subtracting the digital value obtained by AD-converting the black color signal VPIX from the digital value obtained by AD-converting the pixel signal VPIX, for each AD converter.

Figure 20:
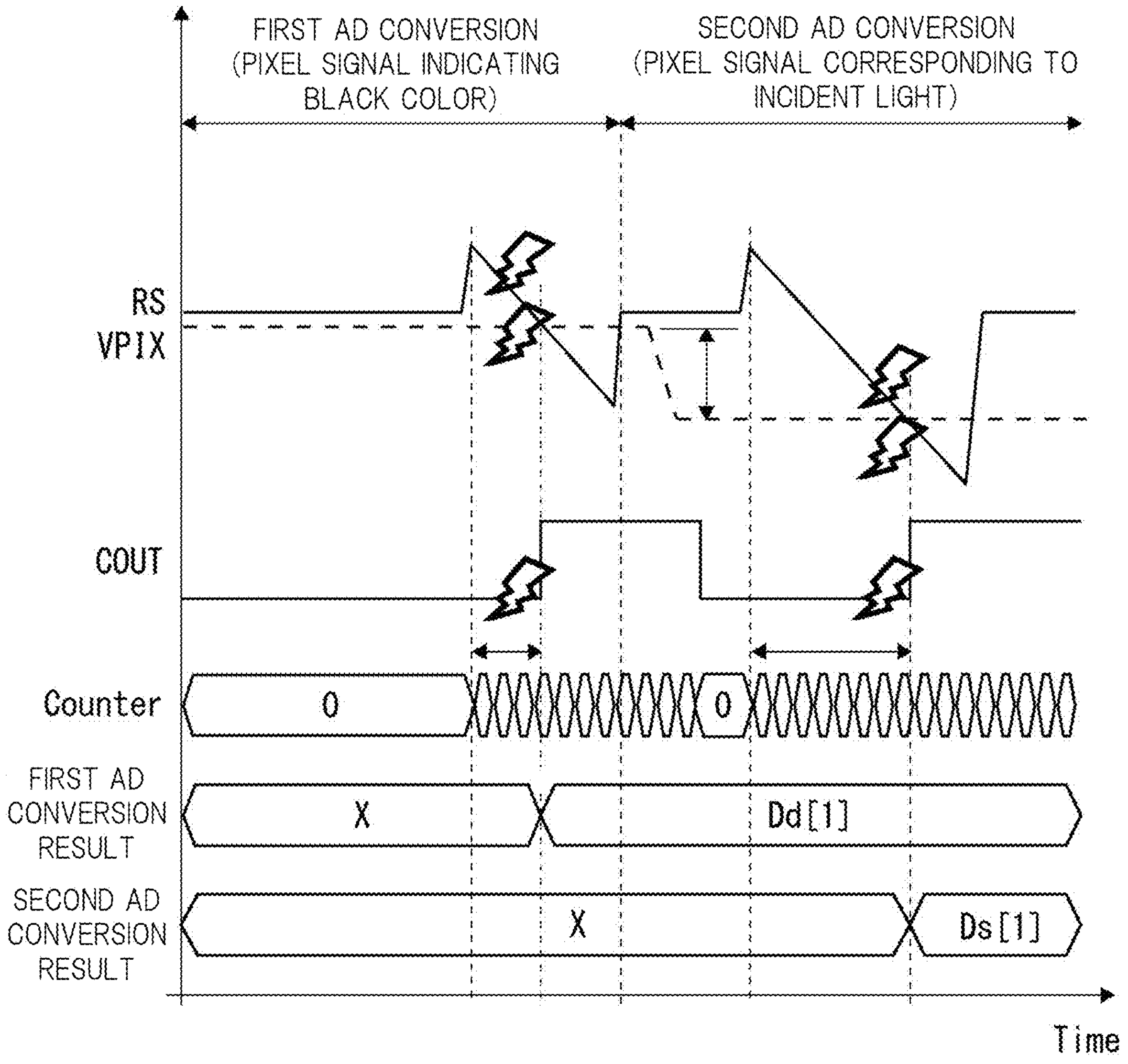
FIG. 20 is a diagram for describing a problem with the second example of AD conversion processing by the image sensor illustrated in FIG. 13.

FIG. 20 is a diagram for describing a problem with the second example of AD conversion processing by the image sensor 50. As illustrated in FIG. 20, when the two-stage AD conversion processing is performed to remove the offset, noise received by the element increases. Note that the noise received by the element mainly includes three types: noise received by the element of the ramp signal generation circuit 55, noise received by the pixel 51, and noise received by the AD converter (the comparison circuit 52 and the latch circuit 53).

Here, when the noise (mainly thermal noise) received by the element is Vsd, noise generated in the first AD conversion processing is Vs (t1), and noise generated in the second AD conversion processing is Vs (t2), an effective value $Vsd_{rms}$ of the noise received by the element is expressed by the following formula (1).

$$Vsd_{rms} = \{Vs(t2) - Vs(t1)\}_{rms} \tag{1}$$

Since the respective effective values of Vs (t2) and Vs (t1) can be expressed as the same $VS_{rms}$, the following formula (2) is established.

$$Vsd_{rms} = \sqrt{(2 \times Vs^2)_{rms}} = \sqrt{2 \times Vs_{rms}} \tag{2}$$

That is, the noise in a case where the two-stage AD conversion processing is performed is √2 times the noise in a case where only the one-stage AD conversion processing is performed.

Figure 21:
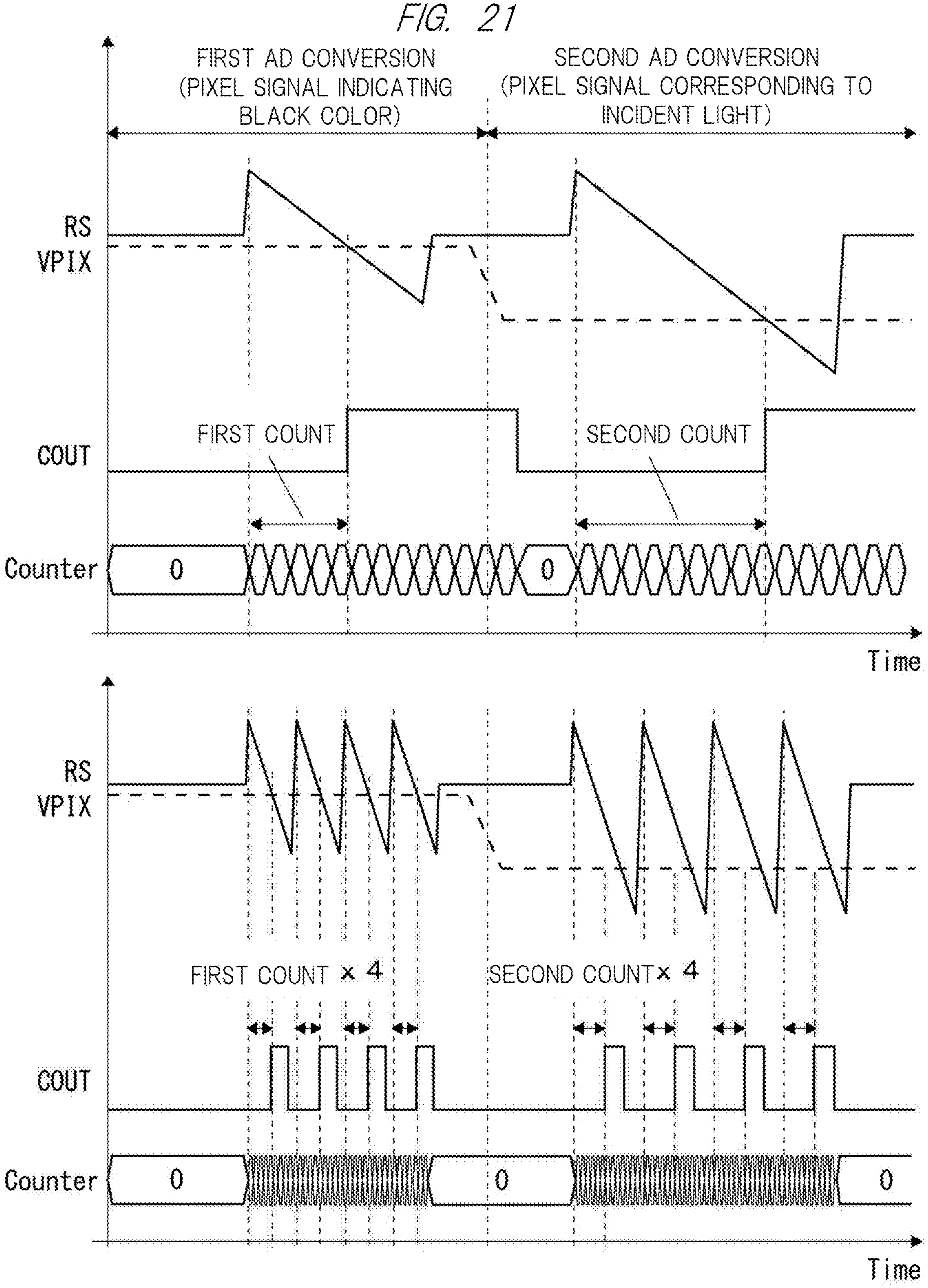
FIG. 21 is a timing chart illustrating a third example of AD conversion processing by the image sensor illustrated in FIG. 13.

Thus, the inventor studied AD conversion processing as illustrated in FIG. 21. FIG. 21 is a timing chart illustrating a third example of AD conversion processing by the image sensor 50. Note that a comparative example is illustrated on the upper side of FIG. 21.

In the example of FIG. 21, each AD converter repeats the first AD conversion processing using the black color signal n times (n is an integer of 2 or more; 4 times in the example of FIG. 21), while repeating the second AD conversion processing using the pixel signal n times. At this time, the ramp signal generation circuit 55 is adjusted such that the speed of the potential change of the ramp signal RS (slope of potential change) is n times that of the comparative example (reference speed). In addition, the counter circuit 54 is adjusted such that the counting operation is n times that of the comparative example (reference speed). The control circuit 56 can obtain a digital value of the pixel signal in which the noise is suppressed to 1/(√n) times by subtracting an average value of n digital values obtained by AD-converting the black color signal VPIX n times from an average value of n digital values obtained by AD-converting the pixel signal VPIX n times, for each AD converter.

Figure 22:
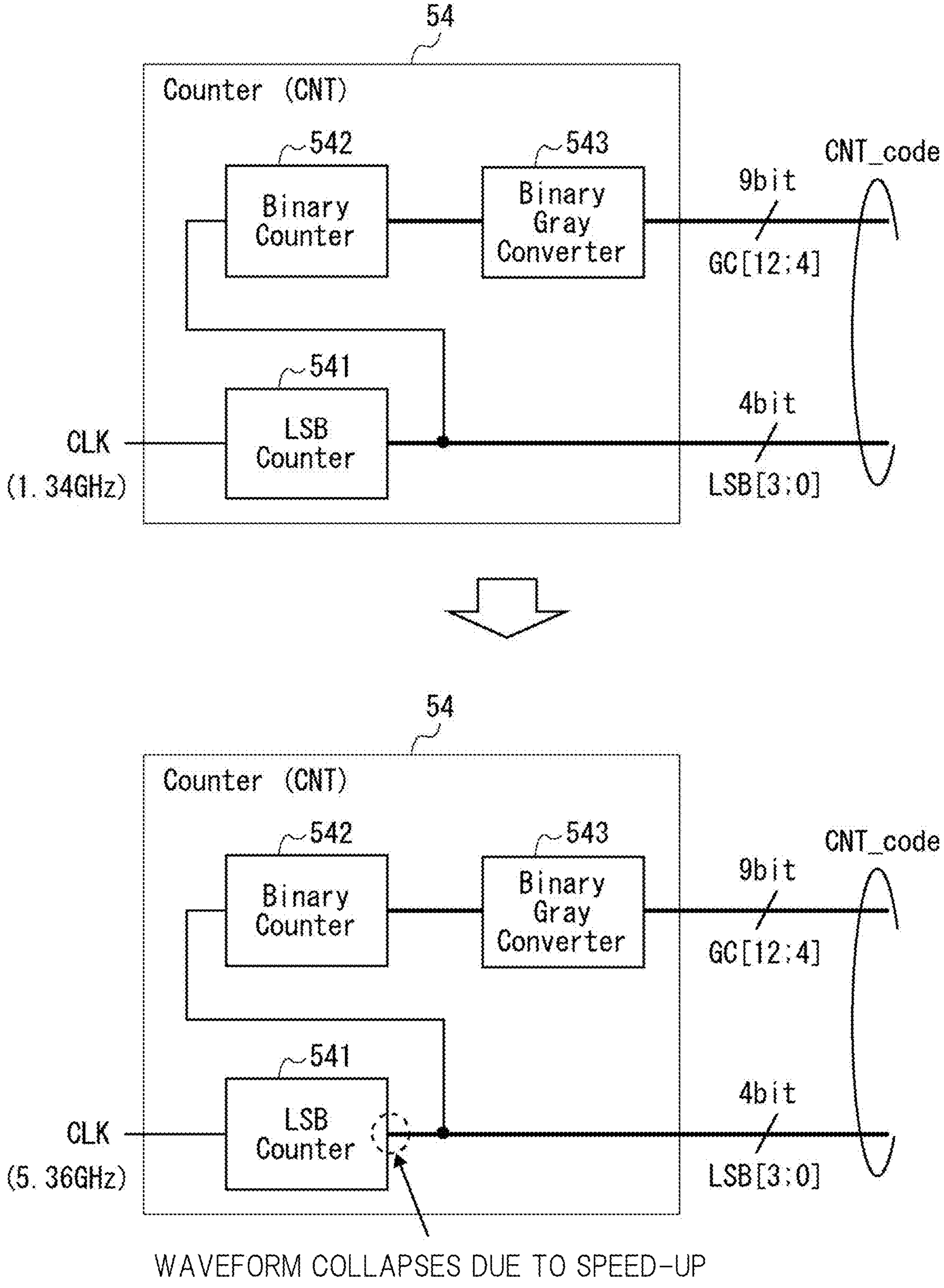
FIG. 22 is a diagram for describing a problem with a third operation of the image sensor illustrated in FIG. 13.

However, as illustrated in FIG. 22, in order to realize the third example of the AD conversion processing at the same processing speed as that of the second example, the image sensor 50 needs to increase the operation frequency of the reference clock signal CLK n times (4 times in this example). When the operation frequency of the reference clock signal CLK is increased from 1.34 GHz to 5.36 GHZ, for example, since a signal line through which the count signal of the counter circuit 54 commonly used for the plurality of AD converters propagates is arranged along one side of the quadrangular semiconductor chip together with the plurality of AD converters, the waveform of the count signal of the counter circuit 54 may collapse due to the long-distance transmission. As a result, there is a problem that the image sensor 50 cannot realize high-quality operation. If a dedicated transmission block using a small-amplitude high-speed I/F or the like is provided, or a repeater circuit is provided at regular intervals in the image sensor 50, to solve this problem, the current consumption and the rotation scale increase.

Therefore, an image sensor 1 capable of realizing high-quality operation has been found.

First Embodiment

Figure 2:
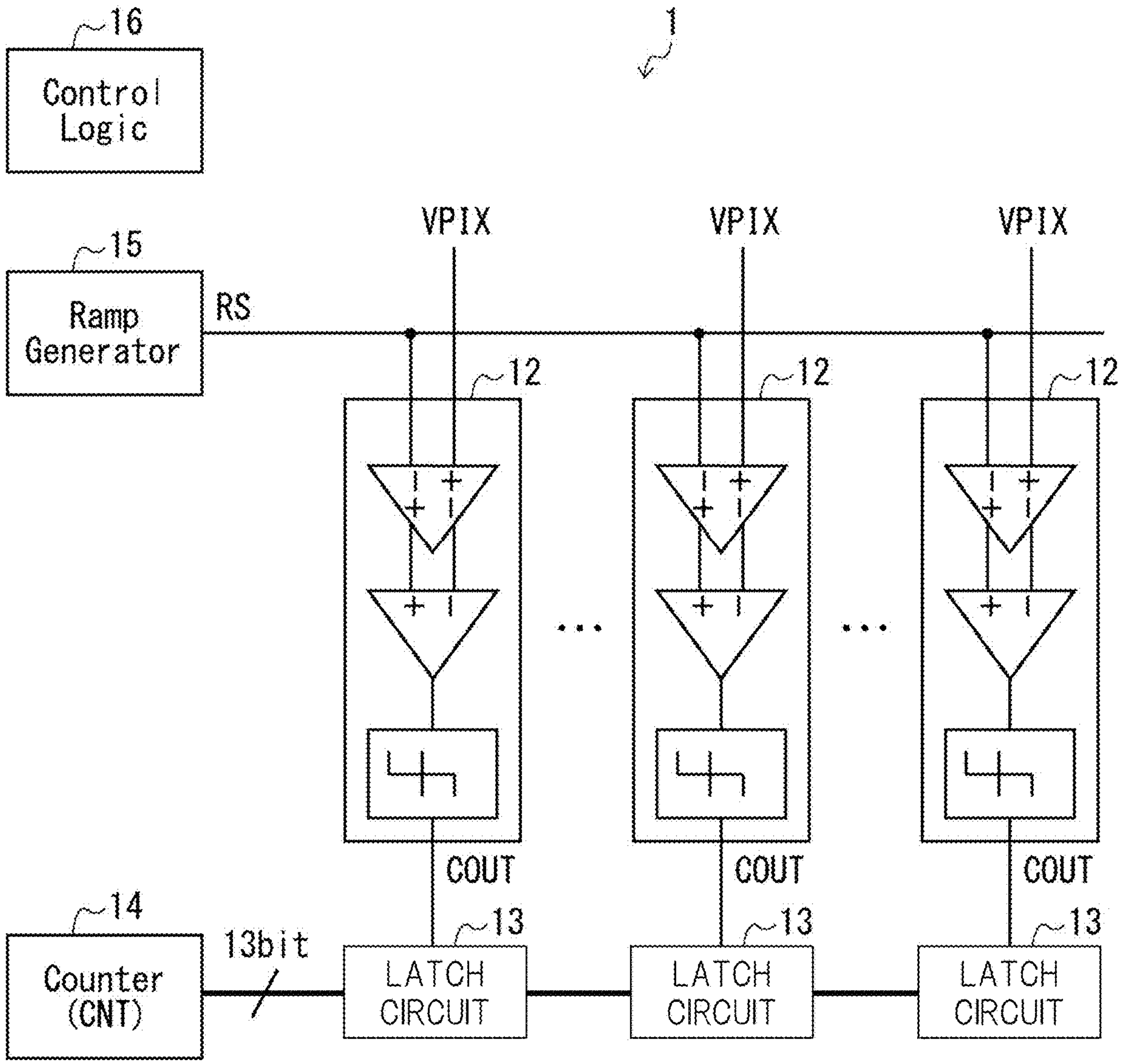
FIG. 2 is a block diagram more specifically illustrating a configuration of a part of the image sensor according to the first embodiment.

FIG. 1 is a block diagram illustrating a configuration example of the image sensor 1. FIG. 2 is a block diagram more specifically illustrating a configuration of a part of the image sensor 1.

As illustrated in FIGS. 1 and 2, the image sensor 1 includes at least a plurality of pixels 11 provided in a matrix, a plurality of comparison circuits (comparator circuits) 12 corresponding to the number of columns of the plurality of pixels 11, a plurality of latch circuits 13 corresponding to the number of columns of the plurality of pixels 11, a counter circuit 14, a ramp signal generation circuit 15, a control circuit 16, and a PLL circuit 17. These circuits are formed on a surface of a semiconductor chip. Note that, in the example of FIG. 1, a group of the plurality of comparison circuits 12, a group of the plurality of latch circuits 13, and the counter circuit 14 are arranged in respective regions on upper and lower sides of a region where the plurality of pixels 11 are formed on the surface of the semiconductor chip. A plurality of AD conversion circuits including the comparison circuits 12 and the latch circuits 13 are arranged along one side of the quadrangular semiconductor chip.

The ramp signal generation circuit 15 generates a ramp signal RS whose potential linearly changes in a horizontal scanning period (access period to a plurality of pixels in each row). In the present embodiment, a case where the ramp signal generation circuit 15 generates a ramp signal RS whose potential linearly decreases in the horizontal scanning period will be described as an example. A specific configuration example of the ramp signal generation circuit 15 is the same as that of the ramp signal generation circuit 55, and thus the description thereof will be omitted.

The PLL circuit 17 generates a reference clock signal CLK. In the present embodiment, a case where the PLL circuit 17 generates a reference clock signal CLK having a frequency of 1.34 GHz will be described as an example.

Each comparison circuit 12 compares a pixel signal (measured signal) VPIX indicating a potential corresponding to the amount of light received by the pixel with the ramp signal RS whose potential linearly decreases in the horizontal scanning period, and outputs a comparison result COUT. For example, when the potential of the ramp signal RS changes from a potential equal to or higher than the potential of the pixel signal VPIX to a potential lower than the potential of the pixel signal VPIX, each comparison circuit 12 changes (rises) the comparison result COUT from an L level to an H level.

The counter circuit 14 performs a count-up operation in synchronization with the reference clock signal CLK.

Each latch circuit 13 latches a count value of the counter circuit 14 at the timing when the comparison result COUT of the corresponding comparison circuit 12 changes from the L level to the H level. That is, each latch circuit 13 latches the count value of the counter circuit 14 counted in the period from the start of the comparison between the pixel signal VPIX and the ramp signal RS by the corresponding comparison circuit 12 to the matching between the pixel signal VPIX and the ramp signal RS. The latched count value is input to a processing circuit (not illustrated) as a digital signal obtained through AD conversion of the pixel signal.

The control circuit 16 performs general control of the image sensor 1. Furthermore, the control circuit 16 performs control for offset removal in AD conversion processing and control for noise suppression in AD conversion processing.

(Configuration Example of Counter Circuit 14)

Figure 3:
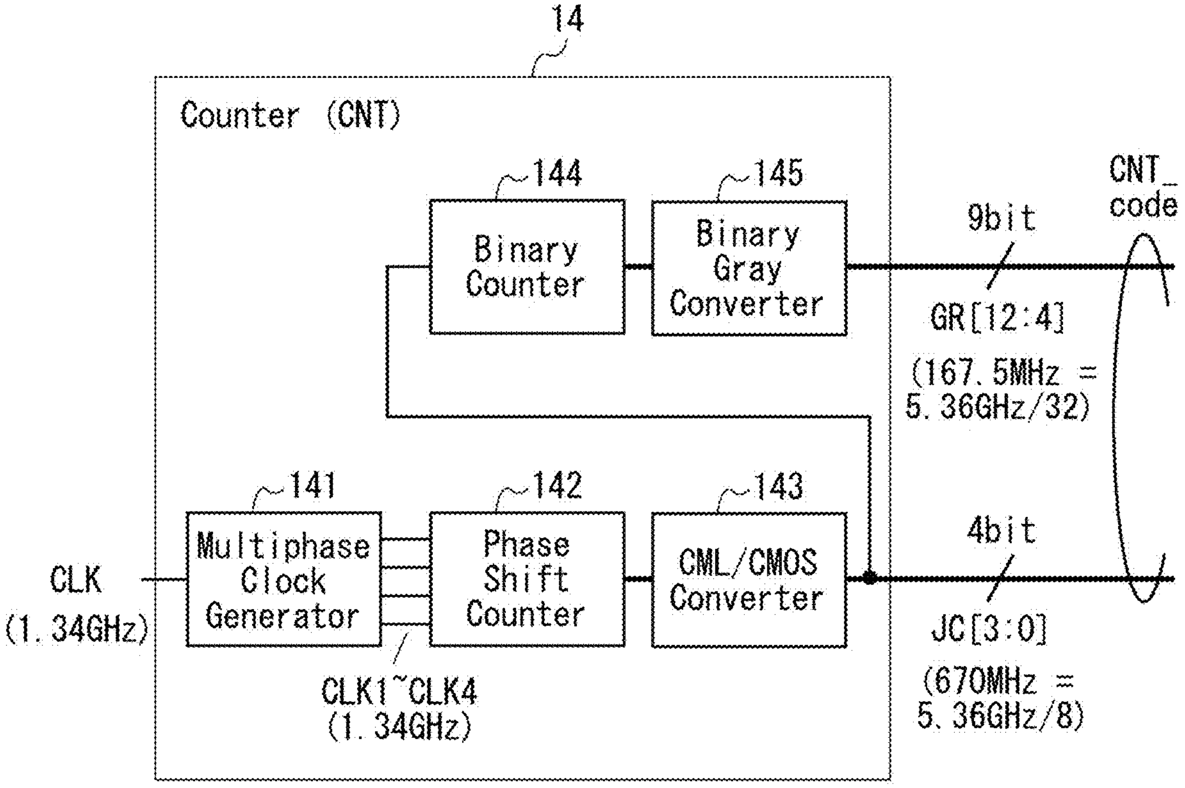
FIG. 3 is a block diagram illustrating a configuration example of a counter circuit provided in the image sensor according to the first embodiment.

FIG. 3 is a block diagram illustrating a configuration example of the counter circuit 14. In the present embodiment, a case where the counter circuit 14 outputs a count signal CNT code of a count value of substantially 12 binary digits represented by a 13-bit value will be described as an example.

As illustrated in FIG. 3, the counter circuit 14 includes a multiphase clock signal generation circuit (multiphase signal generator) 141, a phase shift counter (lower bit counter) 142, a CML/CMOS converter (level conversion circuit) 143, a binary counter (upper bit counter) 144, and a binary gray converter (code conversion circuit) 145.

Both the multiphase clock signal generation circuit 141 and the phase shift counter 142 are configured using a current mode logic (CML) circuit. As a result, in the multiphase clock signal generation circuit 141 and the phase shift counter 142, the collapse (rounding) of the signal waveform is suppressed. The other circuits of the image sensor 1 are not particularly limited, but are basically configured using a complementary metal-oxide-semiconductor (CMOS) circuit.

The multiphase clock signal generation circuit 141 generates four clock signals CLK1 to CLK4 having a different phase from that of the reference clock signal CLK. The frequency of each of the clock signals CLK1 to CLK4 is 1.34 GHZ, which is the same as the frequency of the reference clock signal CLK.

(First Configuration Example of Multiphase Clock Signal Generation Circuit 141)

Figure 4:
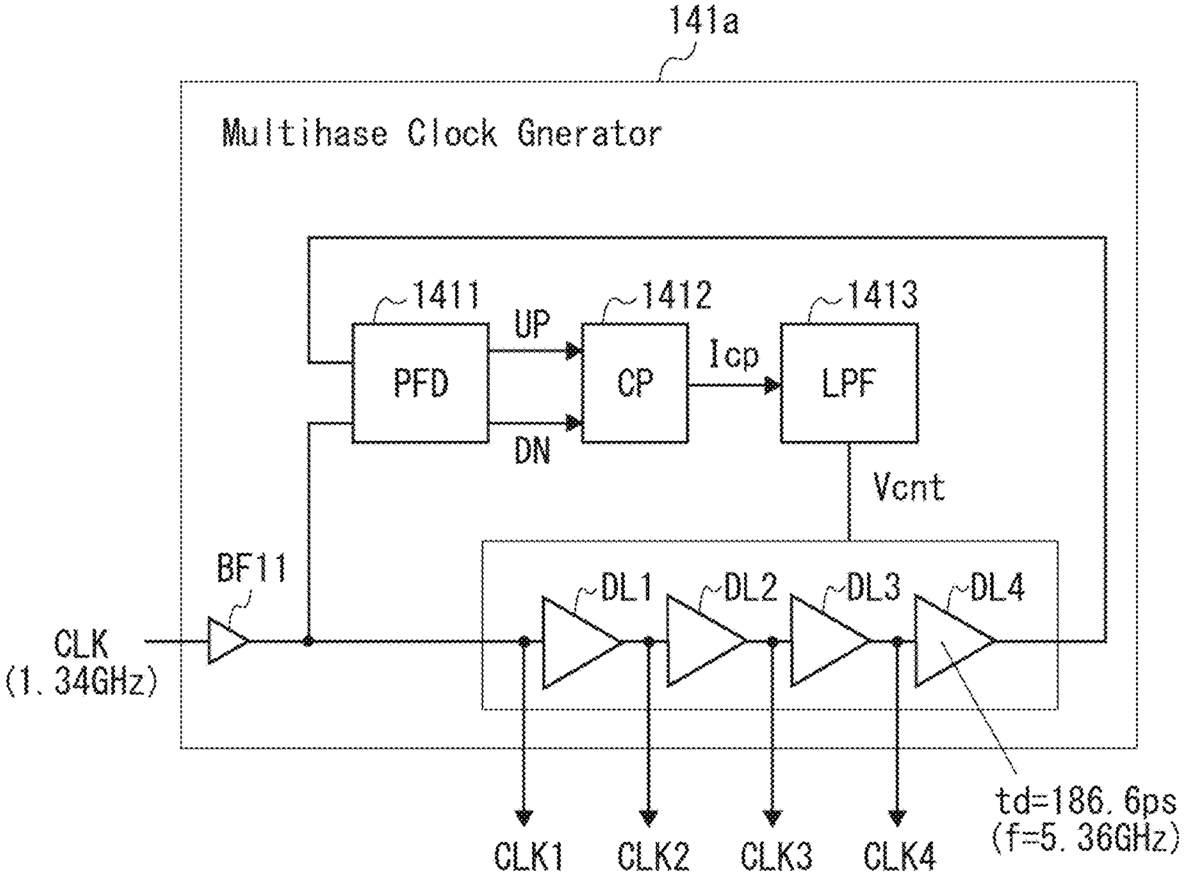
FIG. 4 is a diagram illustrating a first configuration example of a four-phase clock signal generation circuit provided in a counter circuit according to the first embodiment.

FIG. 4 is a diagram illustrating a first configuration example of the multiphase clock signal generation circuit 141 as a multiphase clock signal generation circuit 141*a*. As illustrated in FIG. 4, the multiphase clock signal generation circuit 141*a* includes a buffer BF11, delay circuits DL1 to DL4, and a phase comparator (PFD: phase frequency detector) 1411 and a charge pump (CP: charge pump) 1412, and a low-pass filter (LPF: low-pass filter) 1413.

The buffer BF11 outputs the reference clock signal CLK supplied from the outside. The delay circuits DL1 to DL4 are cascade-connected and output the clock signals CLK1 to CLK4 obtained by delaying the reference clock signal CLK by different delay amounts. The phase comparator 1411 compares the phases of the reference clock signal CLK and the output signal of the final-stage delay circuit DL4, and outputs a comparison result UP or DN. The charge pump outputs a current Icp corresponding to the comparison result UP or DN of the phase comparator 1411. The low-pass filter 1413 filters the voltage generated based on the output current Icp of the charge pump 1412 and outputs a drive voltage Vcnt of the delay circuits DL1 to DL4.

Figure 5:
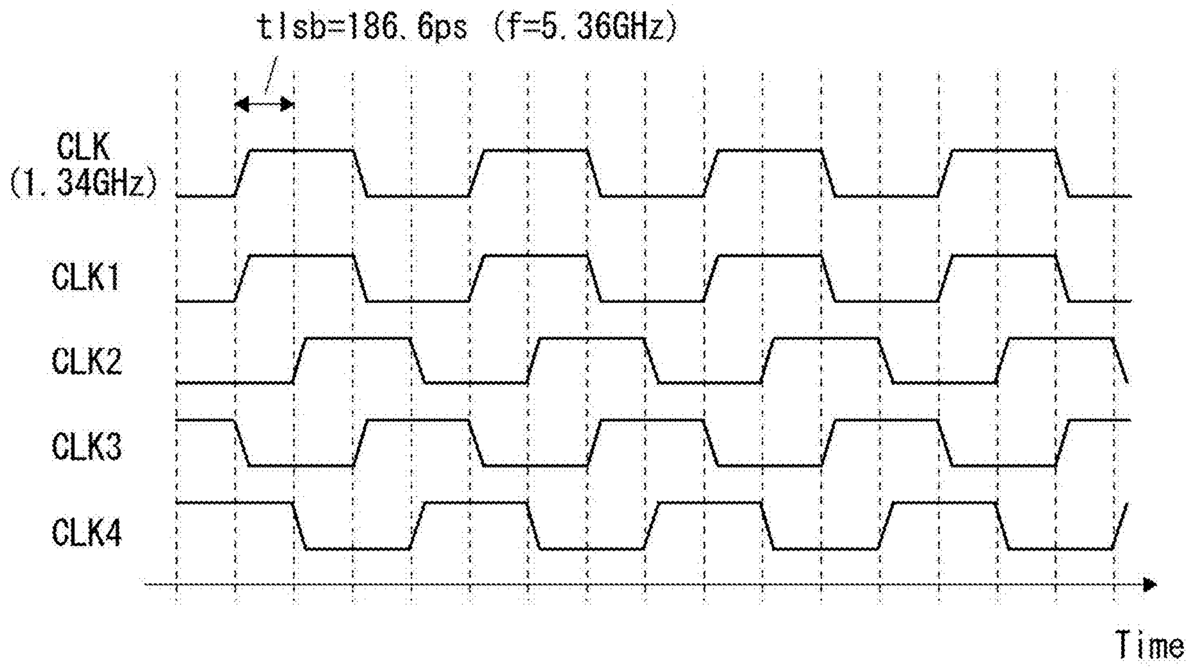
FIG. 5 is a timing chart illustrating an operation of the four-phase clock signal generation circuit illustrated in FIG. 4.

FIG. 5 is a timing chart illustrating an operation of the multiphase clock signal generation circuit 141*a*. As illustrated in FIGS. 4 and 5, the delay amount of each of the delay circuits DL1 to DL4 is, for example, 186.6 ps. Thus, the multiphase clock signal generation circuit 141*a* generates the clock signals CLK1 to CLK4 that are shifted from each other by a ¼ period of the reference clock signal CLK.

(Second Configuration Example of Multiphase Clock Signal Generation Circuit 141)

Figure 6:
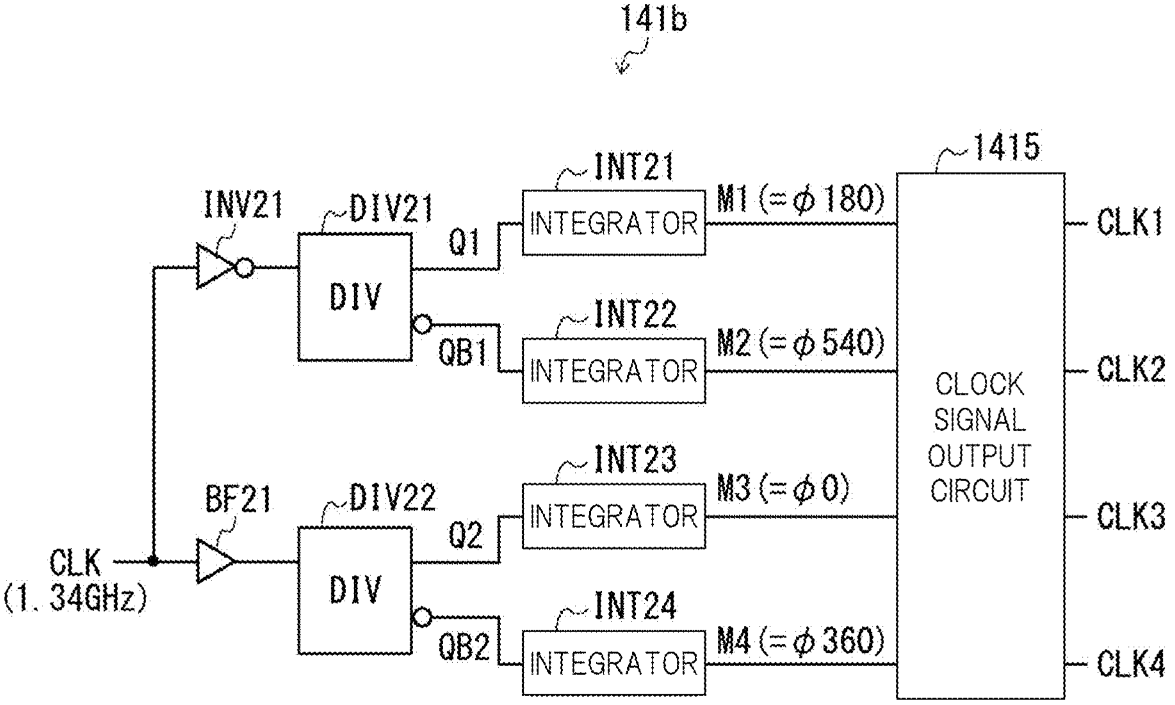
FIG. 6 is a diagram illustrating a second configuration example of the four-phase clock signal generation circuit provided in the counter circuit according to the first embodiment.

FIG. 6 is a diagram illustrating a second configuration example of the multiphase clock signal generation circuit 141 as a multiphase clock signal generation circuit 141*b*. As illustrated in FIG. 6, the multiphase clock signal generation circuit 141*b* includes an inverter INV21, a buffer BF21, frequency division circuits DIV21 and DIV22, integrators INT21 to INT24, and a clock signal output circuit 1415.

The inverter INV21 outputs an inverted signal of the reference clock signal CLK. The buffer BF21 outputs a normal signal of the reference clock signal CLK. The frequency division circuit DIV21 divides the output signal of the inverter INV21 (the inverted signal of the reference clock signal CLK) by two and outputs a frequency division signal Q1 and an inverted signal QB1 thereof. The frequency division circuit DIV22 divides the output signal of the buffer BF21 (the normal signal of the reference clock signal CLK) by two and outputs a frequency division signal Q2 and an inverted signal QB2 thereof. The integrator INT21 performs integration processing on the frequency division signal Q1 and outputs an integration result M1 (=ϕ180). The integrator INT22 performs integration processing on the frequency division signal Q2 and outputs an integration result M2 (=ϕ540). The integrator INT23 performs integration processing on the frequency division signal Q3 and outputs an integration result M3 (=ϕ0). The integrator INT24 performs integration processing on the frequency division signal Q4 and outputs an integration result M4 (=ϕ360). The clock signal output circuit 1415 generates and outputs the clock signals CLK1 to CLK4 based on the integration results M1 to M4 of the integrators INT21 to INT24.

Figure 7:
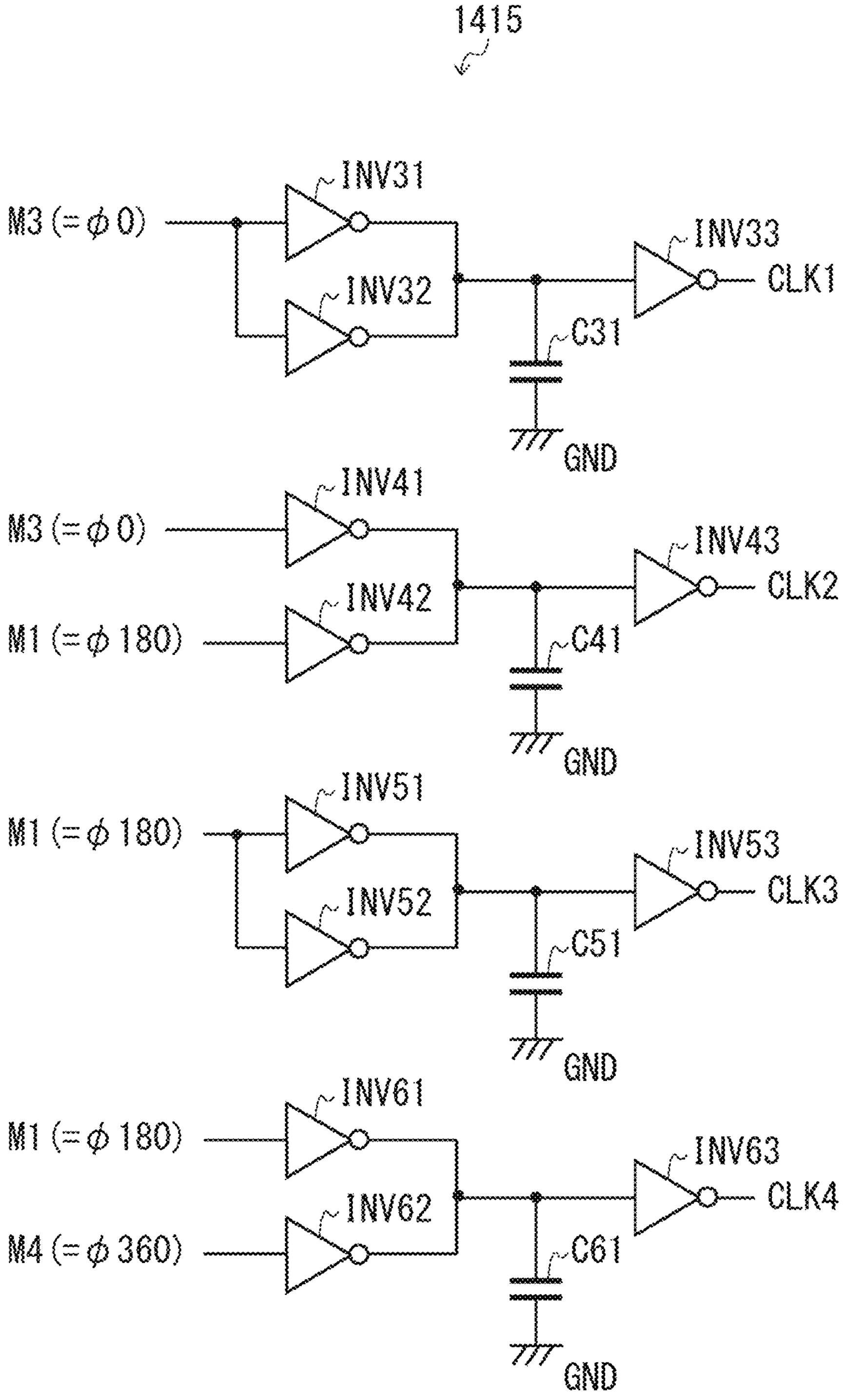
FIG. 7 is a diagram illustrating a configuration example of a clock signal output circuit provided in the four-phase clock signal generation circuit illustrated in FIG. 6.
Figure 8:
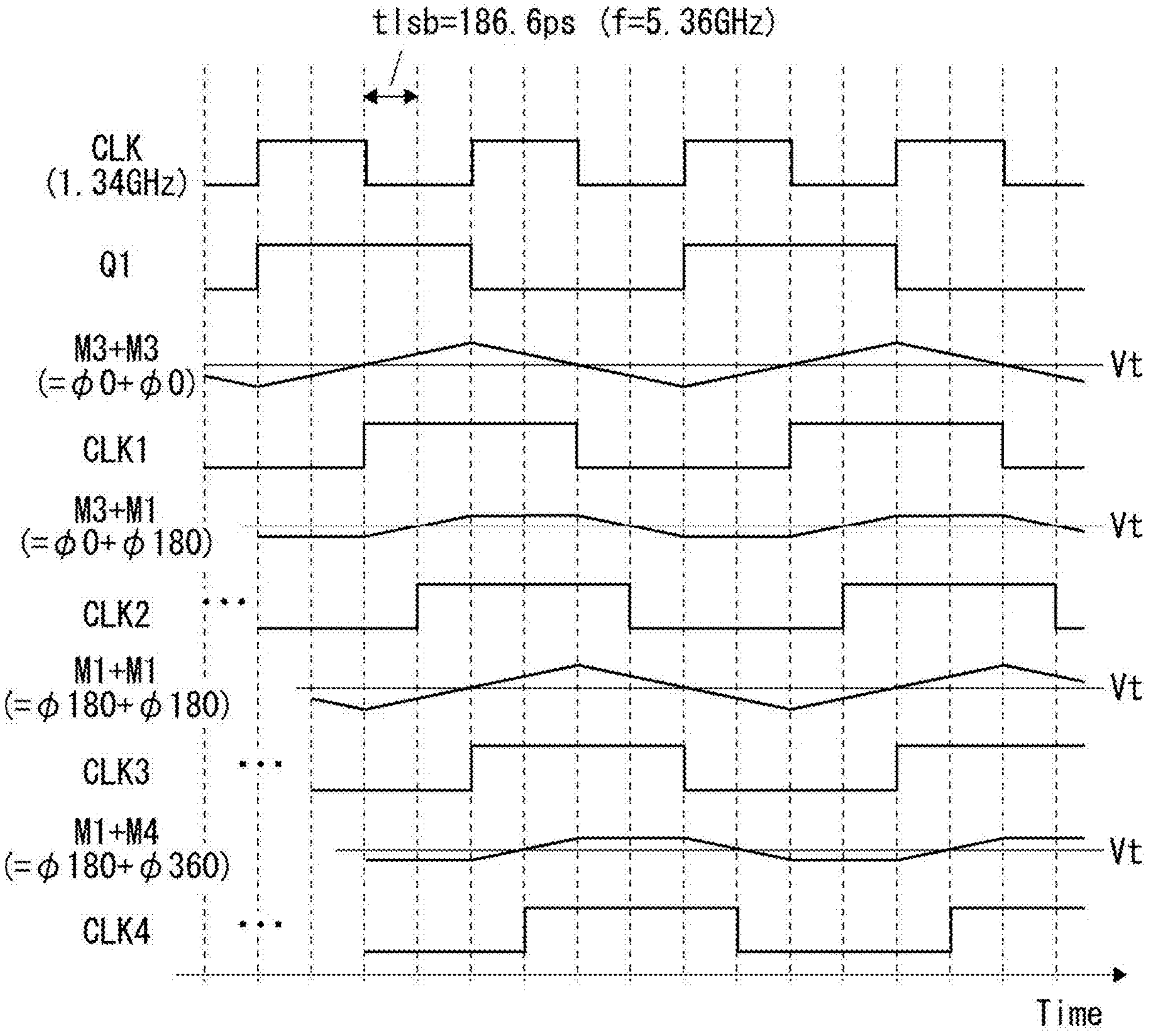
FIG. 8 is a timing chart illustrating an operation of the four-phase clock signal generation circuit illustrated in FIGS. 6 and 7.

FIG. 7 is a diagram illustrating a configuration example of the clock signal output circuit 1415 provided in the multiphase clock signal generation circuit 141*b*. In addition, FIG. 8 is a timing chart illustrating an operation of the multiphase clock signal generation circuit 141*b*.

As illustrated in FIG. 7, the clock signal output circuit 1415 includes inverters INV31 to INV33, INV41 to INV43, INV51 to INV53, and INV61 to INV63, and capacitive elements C31, C41, C51, and C61.

The inverter INV31 outputs an inverted signal of the integration result M3. The inverter INV32 outputs an inverted signal of the integration result M3. The capacitive element C31 is provided between an input terminal of the inverter INV33 and a ground voltage terminal to which a ground voltage GND is supplied. Charges of the respective output signals of the inverters INV31 and INV32 are accumulated in the capacitive element C31. The inverter (logic circuit) INV33 outputs the clock signal CLK1 at an L level when a voltage corresponding to the charges accumulated in the capacitive element C31 is equal to or higher than a threshold voltage Vt, and at an H level when the voltage is lower than the threshold voltage Vt.

The inverter INV41 outputs an inverted signal of the integration result M3. The inverter INV42 outputs an inverted signal of the integration result M1. The capacitive element C41 is provided between an input terminal of the inverter INV43 and a ground voltage terminal to which a ground voltage GND is supplied. Charges of the respective output signals of the inverters INV41 and INV42 are accumulated in the capacitive element C41. The inverter (logic circuit) INV43 outputs the clock signal CLK2 at the L level when a voltage corresponding to the charges accumulated in the capacitive element C41 is equal to or higher than the threshold voltage Vt, and at the H level when the voltage is lower than the threshold voltage Vt.

The inverter INV51 outputs an inverted signal of the integration result M1. The inverter INV52 outputs an inverted signal of the integration result M1. The capacitive element C51 is provided between an input terminal of the inverter INV53 and a ground voltage terminal to which a ground voltage GND is supplied. Charges of the respective output signals of the inverters INV51 and INV52 are accumulated in the capacitive element C51. The inverter (logic circuit) INV53 outputs the clock signal CLK3 at the L level when a voltage corresponding to the charges accumulated in the capacitive element C51 is equal to or higher than the threshold voltage Vt, and at the H level when the voltage is lower than the threshold voltage Vt.

The inverter INV61 outputs an inverted signal of the integration result M1. The inverter INV62 outputs an inverted signal of the integration result M4. The capacitive element C61 is provided between an input terminal of the inverter INV63 and a ground voltage terminal to which a ground voltage GND is supplied. Charges of the respective output signals of the inverters INV61 and INV62 are accumulated in the capacitive element C61. The inverter (logic circuit) INV63 outputs the clock signal CLK4 at the L level when a voltage corresponding to the charges accumulated in the capacitive element C61 is equal to or higher than the threshold voltage Vt, and at the H level when the voltage is lower than the threshold voltage Vt.

The phase shift counter 142 performs a count-up operation of a count value JC [3:0] of substantially binary 3 digits represented by a value of the lower 4 bits of the count value represented by a 13-bit value. Here, the phase shift counter 142 performs a count-up operation of the count value JC [3:0] represented by a value of the lower 4 bits by selectively changing any one of values of the lower 4 bits that change in synchronization with each of the clock signals CLK1 to CLK3. Accordingly, when the operation frequency of the reference clock signal CLK is 1.34 GHz, the operation frequency of the lower 4-bit count s representing the count value JC [3:0] is suppressed to 670 MHZ (=5.36 GHz/8). Therefore, the collapse of the waveform of the lower 4-bit count signal representing the count value JC [3:0] due to the long-distance transmission can be suppressed.

(First Configuration Example of Phase Shift Counter 142)

Figure 9:
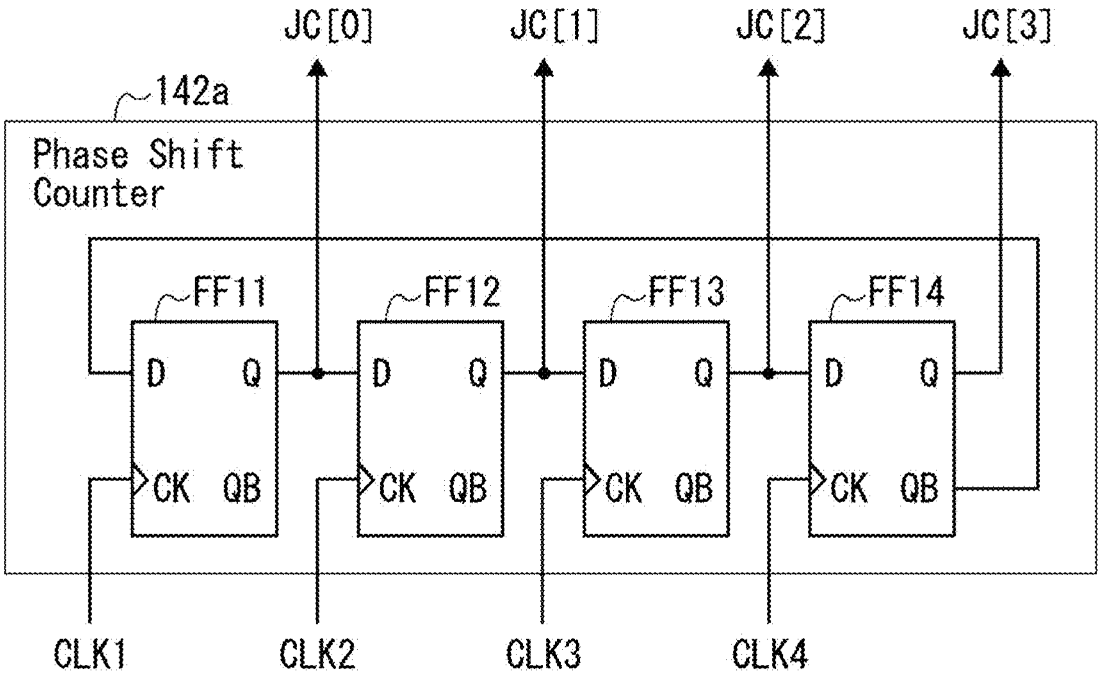
FIG. 9 is a block diagram illustrating a first configuration example of a phase shift counter provided in the counter circuit according to the first embodiment.

FIG. 9 is a diagram illustrating a first configuration example of the phase shift counter 142 as a phase shift counter 142*a*.

As illustrated in FIG. 9, the phase shift counter 142*a* includes four D flip-flops FF11 to FF14. The D flip-flops FF12 to FF14 take in output signals of the D flip-flops FF11 to FF13, respectively, in the preceding stages in synchronization with the clock signals CLK2 to CLK4, and output the results. The D flip-flop FF11 takes in an inverted signal of an output signal of the D flip-flop FF14 in the final stage in synchronization with the clock signal CLK1, and outputs the result. Note that inverting output terminals QB of the D flip-flops FF11 to FF14 other than the D flip-flop FF14 in the final stage among the D flip-flops FF11 to FF13 are not connected to any of the other D flip-flops. Then, the phase shift counter 142*a* outputs the output signals of the D flip-flops FF11 to FF14 as count signals of count values JC [0], JC [1], JC [2], and JC [3], respectively.

(Second Configuration Example of Phase Shift Counter 142)

Figure 10:
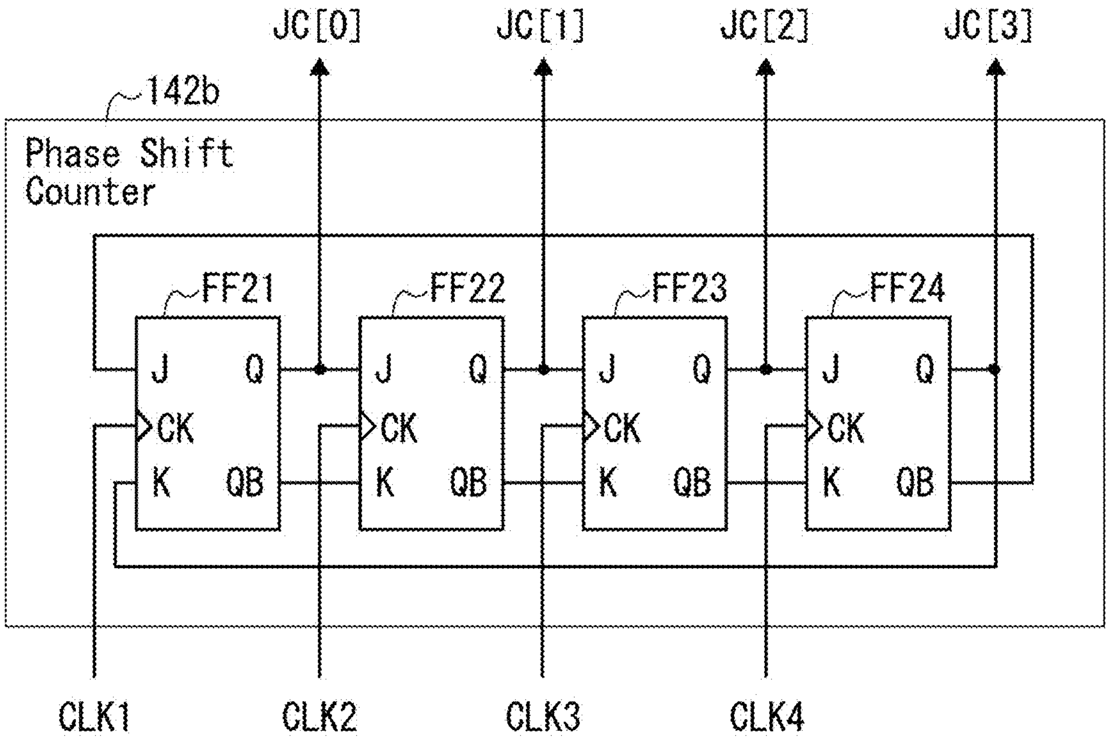
FIG. 10 is a block diagram illustrating a second configuration example of the phase shift counter provided in the counter circuit according to the first embodiment.

FIG. 10 is a diagram illustrating a second configuration example of the phase shift counter 142 as a phase shift counter 142*b*.

As illustrated in FIG. 10, the phase shift counter 142*b* includes four JK flip-flops FF21 to FF24. The JK flip-flops FF22 to FF24 take in output signals and their inverted signals of the JK flip-flops FF21 to FF23, respectively, in the preceding stages at input terminals J, K in synchronization with the clock signals CLK2 to CLK4. The JK flip-flop FF21 takes in an output signal and its inverted signal of the JK flip-flop FF24 in the final stage at an input terminal K, J in synchronization with the clock signal CLK1. Then, the phase shift counter 142*b* outputs the output signals (Q) of the JK flip-flops FF21 to FF24 as count signals of count values JC [0], JC [1], JC [2], and JC [3], respectively.

Note that, in the present embodiment, the case where the phase shift counter 142 performs a count-up operation of the count value JC [3:0] represented by a value of the lower 4 bits of the count value represented by a 13-bit value has been described as an example, but the present invention is not limited thereto. The phase shift counter 142 may be configured to perform a count-up operation of a count value represented by a value of the lower 2 bits or more of the count value represented by a 13-bit value, or a count value represented by all 13-bit values. In this case, the number of flip-flops provided in the phase shift counter 142 is a number corresponding to the number of bits used to represent the count value.

The CML/CMOS converter 143 converts the output signal of the phase shift counter 142 (the count signal of the count value JC [3:0]) from the level of a CML circuit to the level of a CMO circuit. That is, the counter circuit 14 converts the count signal of the count value JC [3:0] output from the phase shift counter 142 into the CMOS level using the CML/CMOS converter 143 and then outputs the CMOS level. As a result, the collapse of the waveform of the lower 4-bit count signal is further suppressed.

The binary counter 144 performs a count-up operation of a count value of a binary code represented by a value of the upper 9 bits of the count value represented by a 13-bit value. In other words, the binary counter 144 counts up the count value of the binary code represented by a value of the upper 9 bits of the count value represented by a 13-bit value based on the count value of the lower bit (carry of the count value of the lower bit).

The binary gray converter 145 converts the count value of the binary code output from the binary counter 144 into a count value GR [12:4] of a gray code. When the operation frequency of the reference clock signal CLK is 1.34 GHZ, the operation frequency of the upper 9-bit count signal representing the count value GR [12:4] is 167 MHZ (=5.36 GHz/32). Here, in the gray code, only the value of any one bit of the 9-bit count value GR [12:4] changes due to one code change, thus reducing erroneous operation.

Then, the counter circuit 14 outputs a count signal CNT code of a 13-bit count value including the count value GR [12:4] and the count value JC [3:0].

Figure 11:
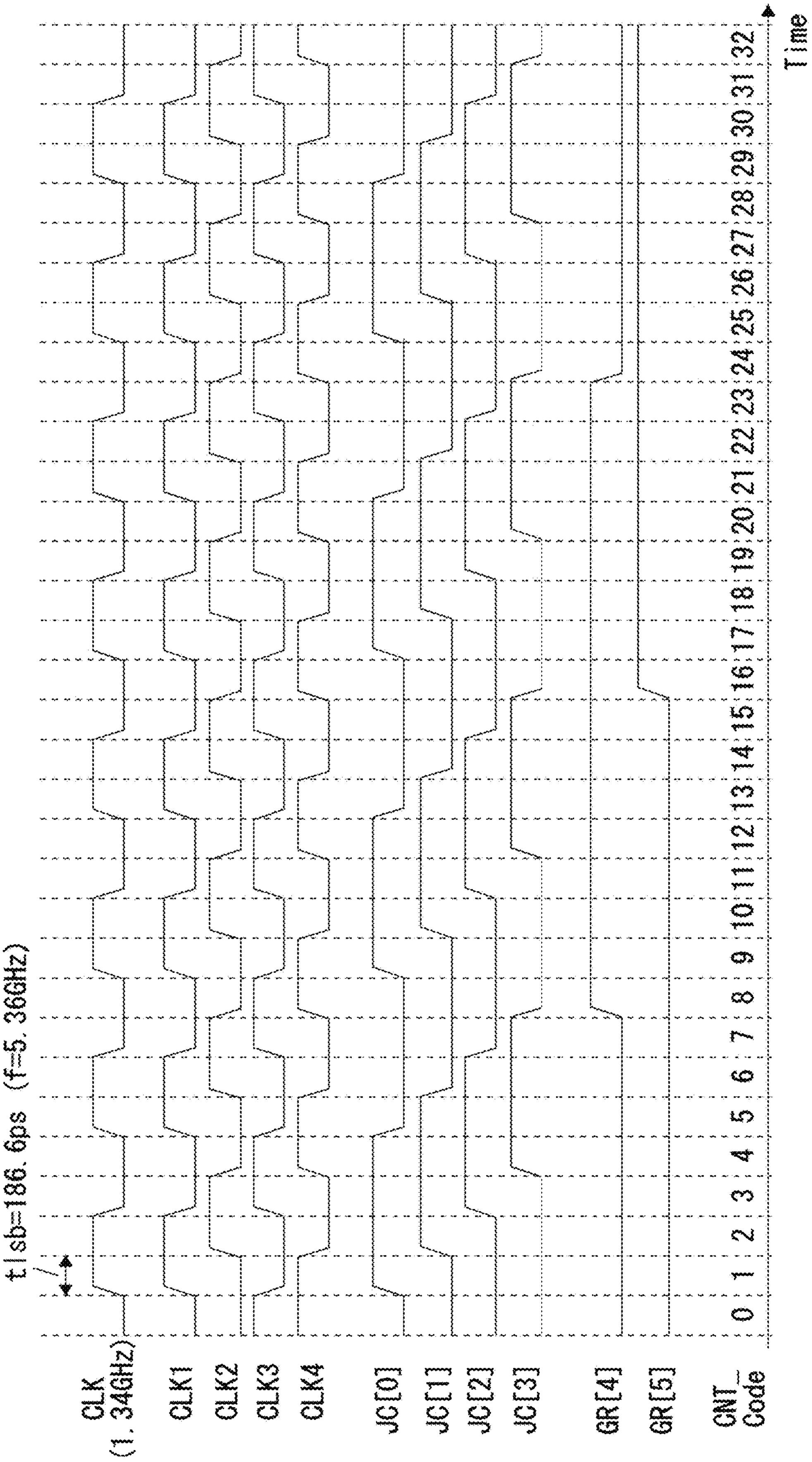
FIG. 11 is a timing chart illustrating an overall operation of the counter circuit according to the first embodiment.

FIG. 11 is a timing chart illustrating an overall operation of the counter circuit 14. As illustrated in FIG. 11, the operation frequency of the clock signals CLK1 to CLK4 generated inside the counter circuit 14 is 1.34 GHZ, which is the same as the operation frequency of the reference clock signal CLK. In addition, the operation frequency of the 13-bit count signal representing the count value of the counter circuit 14 is less than the operation frequency of the reference clock signal CLK. Nevertheless, the counter circuit 14 can implement the counting operation at an operation frequency of 5.36 GHZ, which is 4 times the operation frequency of the reference clock signal CLK. That is, the counter circuit 14 can realize a high-speed counting operation without speeding up the reference clock signal CLK and without speeding up the operation inside. In addition, the counter circuit 14 can thereby realize the counting operation without collapsing the waveform of the count signal. That is, the counter circuit 14 can realize high-speed and high-quality counting operation. Furthermore, in the counter circuit 14, the shape of the signal waveform of each of the 13 bits are not greatly different from each other, thus suppressing a differential non-linearity (DNL) degradation.

For example, the image sensor 1 performs the AD conversion processing as illustrated in FIG. 21. Specifically, in the image sensor 1, each AD converter repeats the first AD conversion processing using the black color signal n (n is an integer of 2 or more; 4 times in the example of FIG. 21) times, while repeating the second AD conversion processing using the pixel signal n times. The control circuit 16 can obtain a digital value of the pixel signal in which the noise is suppressed to $1/(\sqrt{n})$ times by subtracting an average value of n digital values obtained by AD-converting the black color signal VPIX n times from an average value of n digital values obtained by AD-converting the pixel signal VPIX n times, for each AD converter. Here, the image sensor 1 can realize a counter operation equivalent to operation at 5.36 GHz without increasing the operation frequency of the reference clock signal CLK of 1.34 GHz by 4 times to 5.36 GHZ, thus making it possible to realize high-quality operation with suppressed noise without collapsing the waveform of the count signal. Furthermore, the image sensor 1 can significantly reduce the power consumption as compared with a case where the operation frequency of the reference clock signal CLK is increased by 4 times.

Second Embodiment

Figure 12:
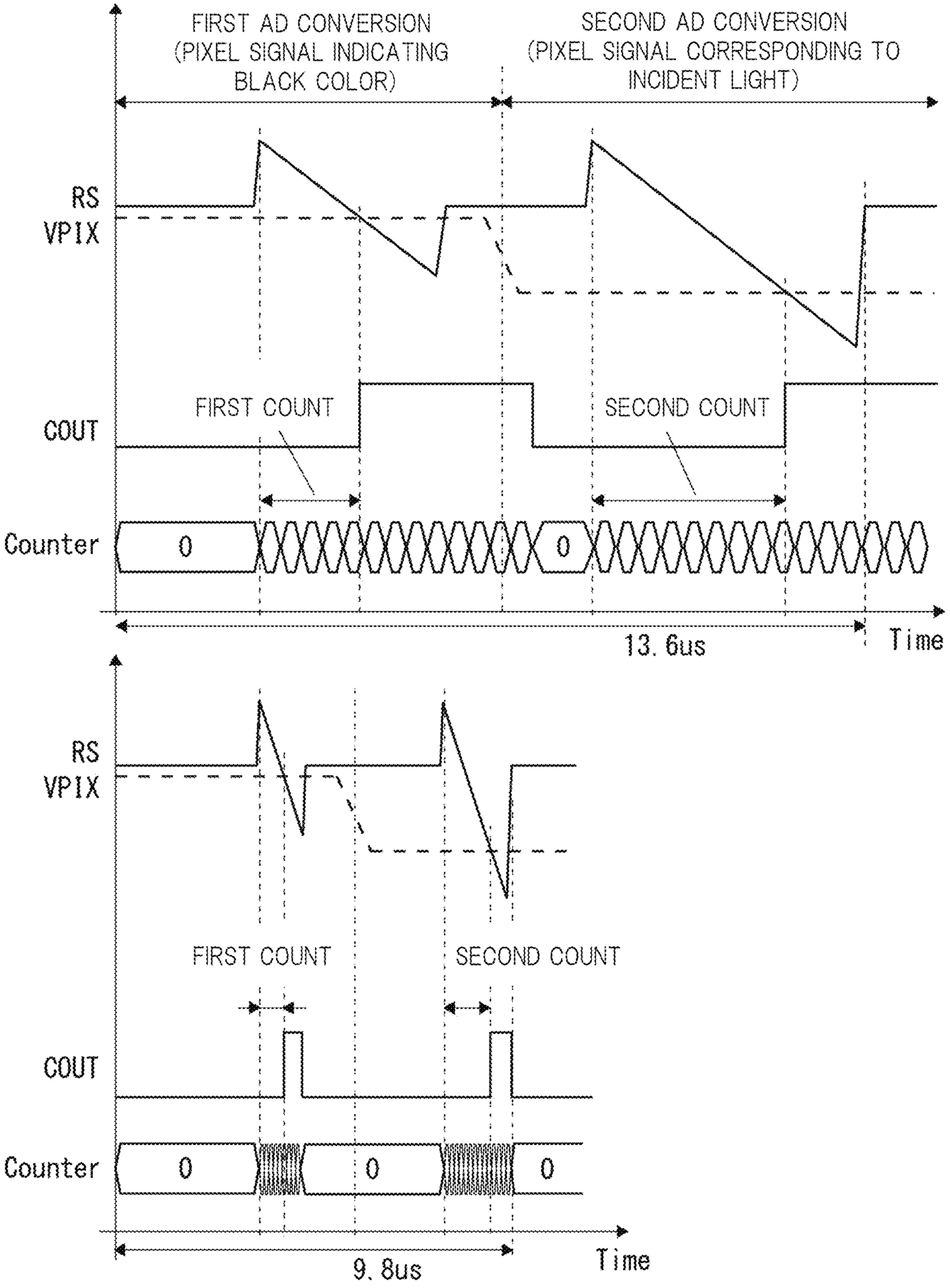
FIG. 12 is a timing chart illustrating an operation of an image sensor according to a second embodiment.

FIG. 12 is a timing chart illustrating an operation of an image sensor 1 according to a second embodiment. A comparative example is illustrated on the upper side of FIG. 12. As illustrated in FIG. 12, in the image sensor 1 according to the second embodiment, each AD converter executes the first AD conversion processing using the black color signal once, and executes the second AD conversion processing using the pixel signal once. The control circuit 16 can obtain a digital value of the pixel signal from which the offset has been removed by subtracting the digital value obtained by AD-converting the black color signal VPIX from the digital value obtained by AD-converting the pixel signal VPIX, for each AD converter. Here, the image sensor 1 according to the second embodiment can realize a counter operation equivalent to operation at 5.36 GHz without increasing the operation frequency of the reference clock signal CLK of 1.34 GHz by 4 times to 5.36 GHZ, thus making it possible to realize a high-speed operation without collapsing the waveform of the count signal. In the example of FIG. 12, the AD conversion processing including the first AD conversion and the second AD conversion is shortened from 13.6 us to 9.8 us.

As described above, the image sensor 1 according to the above-described embodiments and the counter circuit 14 provided in the image sensor 1 can realize high-quality operation without collapsing the waveform of the count signal even in high-speed operation.

Although the invention made by the inventors of this application has been specifically described based on the embodiments, it is needless to say that the present invention is not limited to the above-described embodiments and various modifications can be made without departing from the gist of the present invention.

In the present embodiment, the case where the multiphase clock signal generation circuit 141 generates the four clock signals CLK1 to CLK4 having a different phase from that of the reference clock signal CLK has been described as an example, but the present invention is not limited thereto. The multiphase clock signal generation circuit 141 may be configured to generate p (p is an integer of 2 or more) clock signals CLK1 to CLKp having a different phase from that of the reference clock signal CLK according to a bit width representing the count value.

In addition, in the present embodiment, the case where the counter circuit 14 is applied to the image sensor 1 has been described as an example, but the present invention is not limited thereto. The counter circuit 14 can be applied to various semiconductor devices including an internal circuit that operates based on a count value.

Furthermore, this disclosure can be realized by causing a CPU to execute a computer program for a part or all of the processing of the image sensor 1 or the semiconductor device to which the counter circuit 14 is applied.

The above-described program includes a command group (or software code) for causing a computer to perform one or more functions described in the embodiments when being read by the computer. The program may be stored in a non-transitory computer-readable medium or a tangible storage medium. By way of example and not of limitation, the computer-readable medium or the tangible storage medium includes a random-access memory (RAM), a read-only memory (ROM), a flash memory, a solid-state drive (SSD) or other memory techniques, a CD-ROM, a digital versatile disc (DVD), a Blu-ray® disk or other optical disk storage, a magnetic cassette, a magnetic tape, and a magnetic disk storage or other magnetic storage device. The program may be transmitted on a transitory computer-readable medium or a communication medium. By way of example and not of limitation, the transitory computer-readable medium or the communication medium includes electrical, optical, acoustic, or other forms of propagated signals.

What is claimed is:

1. A semiconductor device comprising a semiconductor chip, wherein the semiconductor chip includes on a surface thereof:

a comparator circuit having one terminal to which a measured signal is input and the other terminal to which a reference voltage signal whose potential periodically linearly changes is input;

a counter circuit whose count value changes in accordance with a time change of the reference voltage signal; and a latch circuit that is connected to the comparator circuit and stores the count value of the counter circuit at a timing when an output signal from the comparator circuit changes, wherein the counter circuit includes:

a multiphase signal generator that shifts a phase of a reference clock signal and generates a plurality of clock signals having phases different from each other; and a plurality of flip-flop circuits that are connected to the multiphase signal generator and are continuously connected to each other, and wherein the plurality of flip-flop circuits include a first-stage flip-flop and second-stage and subsequent flip-flops, the first-stage flip-flop takes in an inverted signal of an output signal of a flip-flop in a final stage and each of the second-stage and subsequent flip-flops takes in an output signal of a flip-flop in a preceding stage in synchronization with each of the plurality of clock signals, and an output signal of each of the plurality of flip-flop circuits is output as a count signal of the count value.

2. The semiconductor device according to claim 1, wherein in the plurality of flip-flop circuits, an inverting output terminal of each flip-flop other than the flip-flop in the final stage is not connected to another flip-flop.

3. The semiconductor device according to claim 1, wherein the semiconductor chip includes on a surface thereof:

a plurality of the comparator circuits; and a plurality of the latch circuits corresponding to the plurality of the comparator circuits, and wherein a count signal representing a count value of the common counter circuit is input to the plurality of the latch circuits.

4. The semiconductor device according to claim 3, wherein the counter circuit outputs the count signal having a longer period than that of the plurality of clock signals.

5. The semiconductor device according to claim 4, wherein the semiconductor chip has a quadrangular shape, and wherein a plurality of signal lines through which the count signal propagates are wired along one side of the quadrangular semiconductor chip.

6. The semiconductor device according to claim 1, further comprising a reference voltage signal generation circuit that generates the reference voltage signal, wherein the reference voltage signal generation circuit is configured so as to start a voltage change of the reference voltage signal in synchronization with a start timing of a counting operation by the counter circuit.

7. The semiconductor device according to claim 6, wherein the reference voltage signal generation circuit generates the reference voltage signal whose voltage change speed is n (n is an integer of 2 or more) times a reference speed, wherein the counter circuit performs a counting operation at a speed n times a reference speed, and wherein the comparator circuit and the latch circuit repeat AD conversion processing of the measured signal n times.

8. The semiconductor device according to claim 1, wherein both the multiphase signal generator and the counter circuit are configured using a current mode logic (CML) circuit, and wherein the semiconductor device further comprises a level conversion circuit that converts an output signal of the counter circuit from a level of the CML circuit to a level of a complementary metal-oxide-semiconductor (CMOS) circuit.

9. The semiconductor device according to claim 1, wherein the multiphase signal generator includes:

a plurality of delay circuits that delay the reference clock signal by different delay amounts and output the reference clock signal as the plurality of clock signals;

a phase comparator that compares phases of an output signal of a final stage of the plurality of delay circuits and the reference clock signal;

a charge pump that outputs a current corresponding to a comparison result by the phase comparator; and a filter that filters a voltage generated based on an output current of the charge pump and outputs a drive voltage of the plurality of delay circuits.

10. The semiconductor device according to claim 1, wherein the multiphase signal generator includes:

a frequency division circuit that divides the reference clock signal to generate a plurality of frequency division signals having different phases;

a plurality of integrators that perform integration processing on each of the plurality of frequency division signals; and a plurality of logic circuits that output the plurality of clock signals of logical values corresponding to each of a plurality of potentials obtained by combining some of integration results of the plurality of integrators.

11. The semiconductor device according to claim 1, wherein the counter circuit further includes an upper bit counter that performs a count-up operation based on a count value of a lower bit counter configured by the plurality of flip-flop circuits, and wherein the counter circuit outputs the count signal using a count value of the lower bit counter and a count value of the upper bit counter as a count value of the counter circuit.

12. The semiconductor device according to claim 11, wherein the upper bit counter is a binary counter that performs a count-up operation based on a count value of the lower bit counter.

13. The semiconductor device according to claim 12, wherein the upper bit counter includes:

a binary counter that performs a count-up operation based on a count value of the lower bit counter; and a code conversion circuit that converts a count value of the binary counter into a gray code.

14. The semiconductor device according to claim 1, further comprising a control circuit, wherein the control circuit causes the comparator circuit to compare a black color signal that is a black pixel signal with the reference voltage signal, causes the latch circuit to latch a first count value that is a count value of the counter circuit in a period from start of comparison between the black color signal and the reference voltage signal at the comparator circuit to matching between the black color signal and the reference voltage signal, causes the comparator circuit to compare a pixel signal that is the measured signal with the reference voltage signal, causes the latch circuit to latch a second count value that is a count value of the counter circuit in a period from start of comparison between the pixel signal and the reference voltage signal at the comparator circuit to matching between the pixel signal and the reference voltage signal, and handles a difference between the second count value and the first count value as a digital signal corresponding to the pixel signal.

15. The semiconductor device according to claim 14, wherein the control circuit causes the comparator circuit to compare the black color signal with the reference voltage signal n (n is an integer of 2 or more) times, causes the latch circuit to latch, n times, a first count value that is a count value of the counter circuit in a period from start of comparison between the black color signal and the reference voltage signal at the comparator circuit to matching between the black color signal and the reference voltage signal, causes the comparator circuit to compare a pixel signal that is the measured signal with the reference voltage signal n times, causes the latch circuit to latch, n times, a second count value that is a count value of the counter circuit in a period from start of comparison between the pixel signal and the reference voltage signal at the comparator circuit to matching between the pixel signal and the reference voltage signal, and handles an average of n times of differences between the second count value and the first count value as a digital signal corresponding to the pixel signal.

16. A method for controlling a semiconductor device, the semiconductor device including a semiconductor chip, wherein the semiconductor chip includes on a surface thereof:

a comparator circuit having one terminal to which a measured signal is input and the other terminal to which a reference voltage signal whose potential periodically linearly changes is input;

a counter circuit whose count value changes in accordance with a time change of the reference voltage signal; and a latch circuit that is connected to the comparator circuit and stores the count value of the counter circuit at a timing when an output signal from the comparator circuit changes, wherein the counter circuit includes:

a multiphase signal generator that shifts a phase of a reference clock signal and generates a plurality of clock signals having phases different from each other; and a plurality of flip-flop circuits that are connected to the multiphase signal generator and are continuously connected to each other, and wherein the plurality of flip-flop circuits include a first-stage flip-flop and second-stage and subsequent flip-flops, the first-stage flip-flop takes in an inverted signal of an output signal of a flip-flop in a final stage and each of the second-stage and subsequent flip-flops takes in an output signal of a flip-flop in a preceding stage in synchronization with each of the plurality of clock signals, and an output signal of each of the plurality of flip-flop circuits is output as a count signal of the count value, the method comprising:

causing the comparator circuit to compare a black color signal that is a black pixel signal with the reference voltage signal;

causing the latch circuit to latch a first count value that is a count value of the counter circuit in a period from start of a comparison between the black color signal and the reference voltage signal at the comparator circuit to matching between the black color signal and the reference voltage signal;

causing the comparator circuit to compare a pixel signal that is the measured signal with the reference voltage signal;

causing the latch circuit to latch a second count value that is a count value of the counter circuit in a period from start of a comparison between the pixel signal and the reference voltage signal at the comparator circuit to matching between the pixel signal and the reference voltage signal; and handling a difference between the second count value and the first count value as a digital signal corresponding to the pixel signal.

17. The method for controlling the semiconductor device according to claim 16, the method further comprising:

causing the comparator circuit to compare the black color signal with the reference voltage signal n (n is an integer of 2 or more) times;

causing the latch circuit to latch, n times, a first count value that is a count value of the counter circuit in a period from start of comparison between the black color signal and the reference voltage signal at the comparator circuit to matching between the black color signal and the reference voltage signal;

causing the comparator circuit to compare a pixel signal that is the measured signal with the reference voltage signal n times;

causing the latch circuit to latch, n times, a second count value that is a count value of the counter circuit in a period from start of comparison between the pixel signal and the reference voltage signal at the comparator circuit to matching between the pixel signal and the reference voltage signal; and handling an average of n times of differences between the second count value and the first count value as a digital signal corresponding to the pixel signal.

18. A non-transitory computer readable medium storing a control program causing a computer to execute control processing in a semiconductor device, the semiconductor device including a semiconductor chip, wherein the semiconductor chip includes on a surface thereof:

a comparator circuit having one terminal to which a measured signal is input and the other terminal to which a reference voltage signal whose potential periodically linearly changes is input;

a counter circuit whose count value changes in accordance with a time change of the reference voltage signal; and a latch circuit that is connected to the comparator circuit and stores the count value of the counter circuit at a timing when an output signal from the comparator circuit changes, wherein the counter circuit includes:

a multiphase signal generator that shifts a phase of a reference clock signal and generates a plurality of clock signals having phases different from each other; and a plurality of flip-flop circuits that are connected to the multiphase signal generator and are continuously connected to each other, and wherein the plurality of flip-flop circuits include a first-stage flip-flop and second-stage and subsequent flip-flops, the first-stage flip-flop takes in an inverted signal of an output signal of a flip-flop in a final stage and each of the second-stage and subsequent flip-flops takes in an output signal of a flip-flop in a preceding stage in synchronization with each of the plurality of clock signals, and an output signal of each of the plurality of flip-flop circuits is output as a count signal of the count value, the control program causing the computer to execute the processing of:

causing the comparator circuit to compare a black color signal that is a black pixel signal with the reference voltage signal;

causing the latch circuit to latch a first count value that is a count value of the counter circuit in a period from start of a comparison between the black color signal and the reference voltage signal at the comparator circuit to matching between the black color signal and the reference voltage signal;

causing the comparator circuit to compare a pixel signal that is the measured signal with the reference voltage signal;

causing the latch circuit to latch a second count value that is a count value of the counter circuit in a period from start of a comparison between the pixel signal and the reference voltage signal at the comparator circuit to matching between the pixel signal and the reference voltage signal; and handling a difference between the second count value and the first count value as a digital signal corresponding to the pixel signal.

19. The non-transitory computer readable medium storing the control program according to claim 18, causing computer to execute the processing of: causing the comparator circuit to compare the black color signal with the reference voltage signal n (n is an integer of 2 or more) times;

causing the latch circuit to latch, n times, a first count value that is a count value of the counter circuit in a period from start of comparison between the black color signal and the reference voltage signal at the comparator circuit to matching between the black color signal and the reference voltage signal;

causing the comparator circuit to compare a pixel signal that is the measured signal with the reference voltage signal n times;

causing the latch circuit to latch, n times, a second count value that is a count value of the counter circuit in a period from start of comparison between the pixel signal and the reference voltage signal at the comparator circuit to matching between the pixel signal and the reference voltage signal; and handling an average of n times of differences between the second count value and the first count value as a digital signal corresponding to the pixel signal.

* * * * *